United States Patent
Kakde et al.

(10) Patent No.: US 11,630,973 B2
(45) Date of Patent: *Apr. 18, 2023

(54) QUALITY PREDICTION USING PROCESS DATA

(71) Applicant: SAS Institute Inc., Cary, NC (US)

(72) Inventors: Deovrat Vijay Kakde, Cary, NC (US); Haoyu Wang, Cary, NC (US); Anya Mary McGuirk, Holly Springs, NC (US)

(73) Assignee: SAS Institute Inc., Cary, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/944,291

(22) Filed: Sep. 14, 2022

(65) Prior Publication Data

US 2023/0025373 A1 Jan. 26, 2023

Related U.S. Application Data

(63) Continuation of application No. 17/581,113, filed on Jan. 21, 2022, now Pat. No. 11,501,116.
(Continued)

(51) Int. Cl.
*G06K 9/00* (2022.01)
*G06K 9/62* (2022.01)
(Continued)

(52) U.S. Cl.
CPC ......... *G06K 9/6265* (2013.01); *G06N 20/00* (2019.01); *H01L 22/20* (2013.01)

(58) Field of Classification Search
CPC ................................................ H01L 29/7869
See application file for complete search history.

(56) References Cited

U.S. PATENT DOCUMENTS 6,145,107 A * 11/2000 Farokhzad ......... G01R 31/2608
257/355
6,286,749 B1 9/2001 Lee et al.
(Continued)

FOREIGN PATENT DOCUMENTS

| WO | 9613055 A2 | 5/1996 |
| WO | 2006110266 A2 | 10/2006 |
| WO | 2014052742 A1 | 4/2014 |

OTHER PUBLICATIONS

Department of Defense, "Test Method Standard—Microcircuits", Apr. 25, 2016, pp. 1-765, MIL-STD-883K, DoD.
(Continued)

*Primary Examiner* — Hadi Akhavannik
(74) *Attorney, Agent, or Firm* — Coats & Bennett, PLLC

(57) ABSTRACT

A computing device accesses a machine learning model trained on training data of first bonding operations (e.g., a ball and/or stitch bond). The first bonding operations comprise operations to bond a first set of multiple wires to a first set of surfaces. The machine learning model is trained by supervised learning. The device receives input data indicating process data generated from measurements of second bonding operations. The second bonding operations comprise operations to bond a second set of multiple wires to a second set of surfaces. The device weights the input data according to the machine learning model. The device generates an anomaly predictor indicating a risk for an anomaly occurrence in the second bonding operations based on weighting the input data according to the machine learning model. The device outputs the anomaly predictor to control the second bonding operations.

30 Claims, 31 Drawing Sheets

Related U.S. Application Data

(60) Provisional application No. 63/223,491, filed on Jul. 19, 2021.

(51) Int. Cl.
*G06N 20/00* (2019.01)
*H01L 21/66* (2006.01)

(56) References Cited

U.S. PATENT DOCUMENTS

| | | | |
|---|---|---|---|
| 6,564,115 | B1 | 5/2003 | Kinnaird |
| 8,893,953 | B2 | 11/2014 | Lee |
| 9,331,049 | B2 | 5/2016 | Uno et al. |
| 9,640,531 | B1 | 5/2017 | Or-Bach et al. |
| 10,128,130 | B2 | 11/2018 | Yagyu |
| 10,191,480 | B2 * | 1/2019 | He .................. G01M 99/008 |
| 11,169,201 | B2 * | 11/2021 | Degrenne ............ G01R 31/26 |
| 2004/0036171 | A1 | 2/2004 | Farnworth et al. |
| 2005/0077623 | A1 * | 4/2005 | Roberts ................ H01L 24/05 257/E33.059 |
| 2006/0228825 | A1 | 10/2006 | Hembree |
| 2008/0111250 | A1 * | 5/2008 | Melville .............. H01L 24/05 257/E23.141 |
| 2008/0274608 | A1 * | 11/2008 | Melville .............. H01L 24/05 257/E21.575 |
| 2010/0280646 | A1 * | 11/2010 | Hesse .................. H01L 22/00 700/110 |
| 2014/0284779 | A1 | 9/2014 | Hayata et al. |
| 2015/0322586 | A1 | 11/2015 | Lyn et al. |
| 2016/0322329 | A1 | 11/2016 | Garing et al. |
| 2019/0146032 | A1 * | 5/2019 | Stine .................. G06N 3/0454 714/737 |
| 2020/0117580 | A1 | 4/2020 | Lekivetz et al. |
| 2020/0408830 | A1 * | 12/2020 | Degrenne ............ G01R 31/70 |
| 2021/0010953 | A1 | 1/2021 | Adler et al. |

OTHER PUBLICATIONS

Hastie, T. et al., "Chapter 10: Boosting and Additive Trees", The Elements of Statistical Learning: Data Mining, Inference, and Prediction, 2nd Edition, Aug. 26, 2009, pp. 337-388, Springer.

Zheng, H. et al., "Effect of die shape on die tilt in die attach process", 2013 14th International Conference on Electronic Packaging Technology, Aug. 11, 2013, pp. 651-655, IEEE.

Lin, N. et al., "Copper Wire Bonding Challenges and Solutions of Small Outline Packages", 2010 12th Electronics Packaging Technology Conference, Dec. 8, 2010, pp. 603-607, IEEE.

Friedman, J., "Greedy Function Approximation: A Gradient Boosting Machine", The Annals of Statistics, vol. 29 No. 5, Oct. 1, 2001, pp. 1189-1232, Institute of Mathematical Statistics.

SAS, "SAS Data Mining and Machine Learning", SAS Support Communities, Jul. 6, 2016, pp. 1-7, retrieved on Dec. 1, 2021, retrieved from internet: https://communities.sas.com/t5/SAS-Data-Mining-and-Machine/Weight-in-Gradient-Boosting/td-p/282454.

Van der Laan, M., "Statistical Inference for Variable Importance", The International Journal of Biostatistics, vol. 2 No. 1, Jan. 1, 2006, pp. 1-31, De Gruyter.

Plasmatreat, "Secure wire bonding thanks to Plasma cleaning (atmospheric or low-pressure)", Jan. 1, 2021, pp. 1-5, retrieved on Jan. 20, 2022, retrieved from internet: https://www.plasmatreat.com/industrial-applications/electronics/led/secure-wire-bonding-thanks-to-plasma-cleaning.html.

Circuitnet, "Lead Frame Contamination", Nov. 17, 2008, pp. 1-2, retrieved on Dec. 1, 2021, retrieved from internet: https://www.circuitnet.com/experts/54134.html.

Inmann, A. et al., "Implantable Sensor Systems for Medical Applications Index", Jan. 1, 2013, pp. 497-510, retrieved on Sep. 20, 2021, retrieved from internet: https://www.sciencedirect.com/science/article/pii/B9781845699871500223.

Tsutsui, Y. et al., "Size Effect of Ag Nanoparticles on Laser Sintering and Wire Bondability", 2010 Electronic Components and Technology Conference, Jun. 1, 2010, pp. 1870-1876, IEEE.

Wikipedia, "Wire Bonding", Jul. 13, 2021, retrieved on Sep. 20, 2021, retrieved from internet: https://en.wikipedia.org/wiki/Wire_bonding.

Sciencedirect, "Bonding Wire—An Overview", Acoustic Wave Sensors, Jan. 1, 2021, retrieved on Sep. 20, 2021, retrieved from internet: https://www.sciencedirect.com/topics/engineering/bonding-wire.

Dymel, C. et al., "Numerical and statistical investigation of weld formation in a novel two-dimensional copper-copper bonding process", 2018 7th Electronic System-Integration Technology Conference (ESTC), Sep. 18, 2018, pp. 1-6, IEEE.

Li, W., "A Study of Plasma-Cleaned Ag-Plated Cu Leadframe Surfaces", Journal of Electronic Materials, vol. 28 No. 3, Dec. 9, 2009, pp. 295-302, Springer.

Haldos, R. et al., "Real-time Monitoring of the Semiconductor Wirebond Interconnection Process for Production Yield and Quality Improvement", Proceedings of the International Conference on Industrial Engineering and Operations Management, Mar. 10, 2010, pp. 678-686, IEOM Society International.

Computer Hope, "Wafer", Oct. 17, 2017, pp. 1-1, retrieved on Sep. 20, 2021, retrieved from internet: https://www.computerhope.com/jargon/w/wafer.htm.

Wikipedia, "Lead Frame", Jul. 20, 2021, pp. 1-2, retrieved on Sep. 20, 2021, retrieved from internet: https://en.wikipedia.org/wiki/Lead_frame.

Lau, J., "Recent Advances and New Trends in Semiconductor Packaging", IEEE/CMPT Society Lecture in the Santa Clara Valley, Apr. 18, 2016, pp. 1-49, IEEE.

Mayer, M. et al., "Ultrasonic Bonding: Understanding How Process Parameters Determine the Strength of Au—Al Bonds", Proceedings of the International Symposium on Microelectronics, Denver, US, Sep. 4, 2002, pp. 626-631, IMAPS.

Sun, L. et al., "Factors governing heat affected zone during wire bonding", Transactions of Nonferrous Metals Society of CHine, vol. 19 No 2, Sep. 1, 2009, pp. s490-s494, Elsevier.

Finney, K., "Ball Bonding and the Electronic Flame-Off Process", Oct. 11, 2016, pp. 1-3, retrieved on Jan. 25, 2022, retrieved from internet: https://www.palomartechnologies.com/blog/ball-bonding-and-the-electronic-flame-off-process.

Perr, D., "Measuring Wire Bonding Ultrasonic Performance", Aug. 15, 2011, pp. 1-2, retrieved on Jan. 25, 2022, retrieved from internet: https://www.palomartechnologies.com/blog/bid/67198/measuring-wire-bonding-ultrasonic-performance.

Korstanje, J., "The F1 Score", Aug. 31, 2021, pp. 1-10, retrieved on Jun. 6, 2022, retrieved from internet: https://towardsdatascience.com/the-f1-score-bec2bbc38aa6.

Hsu, H., "The development of a RFID and agent-based lot management controller for PROMIS in a client/server structure for IC assembly firm", Journal of Industrial and Production Engineering, vol. 32 No. 8, Sep. 23, 2015, pp. 538-550, Taylor & Francis.

Chou, J., "Optimal Parameter Design for IC Wire Bonding Process by Using Fuzzy Logic and Taguchi Method", IEEE Access, vol. 4, Jun. 15, 2016, pp. 3034-3045, IEEE.

Written Opinion dated Apr. 11, 2022 in re PCT application No. PCT/US22/13319 filed Jan. 21, 2022, pp. 1-15.

* cited by examiner

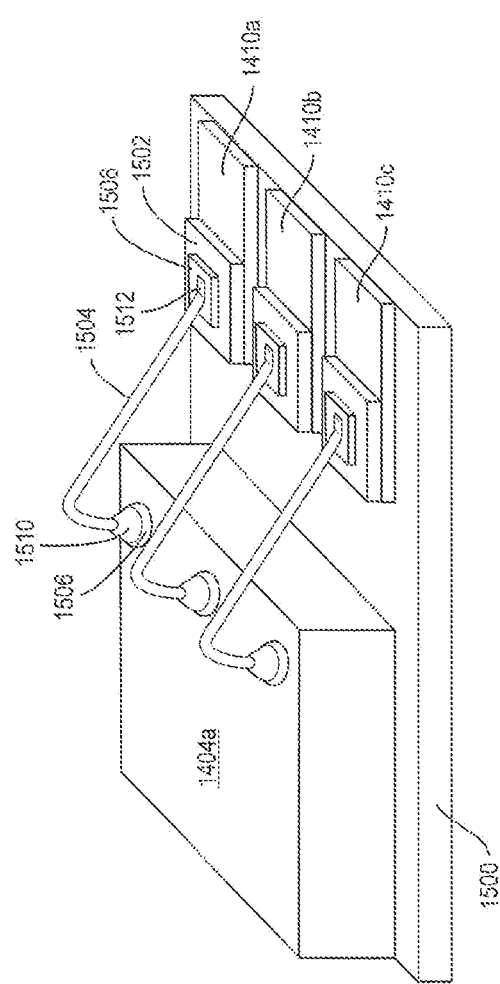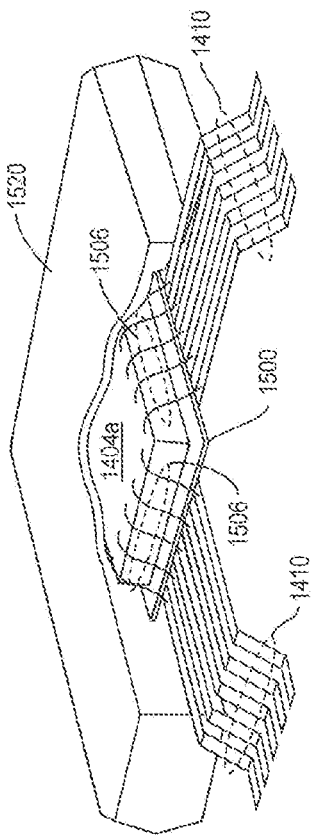
FIG. 15A
FIG. 15B

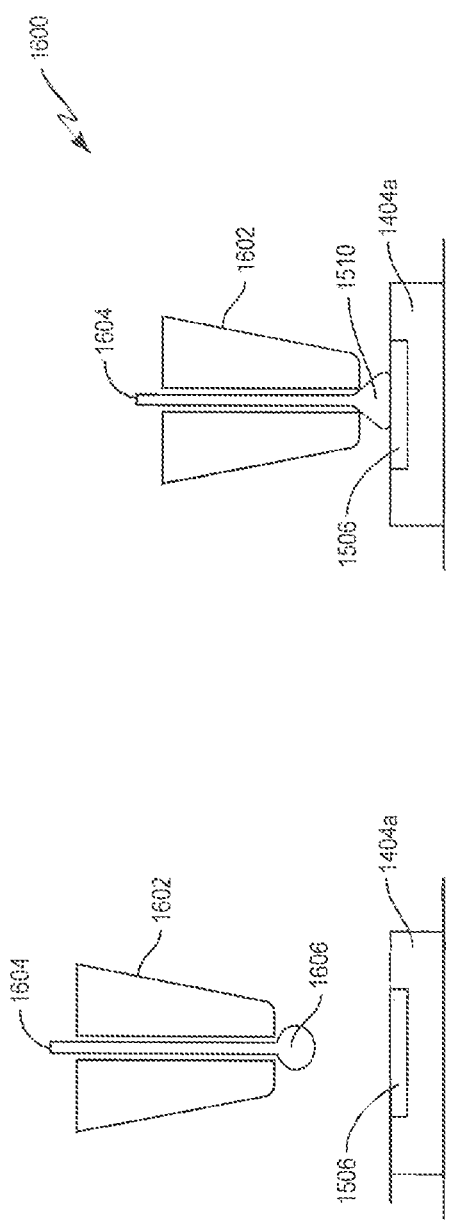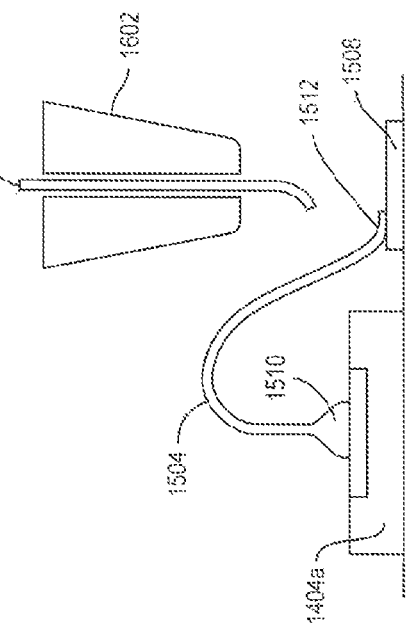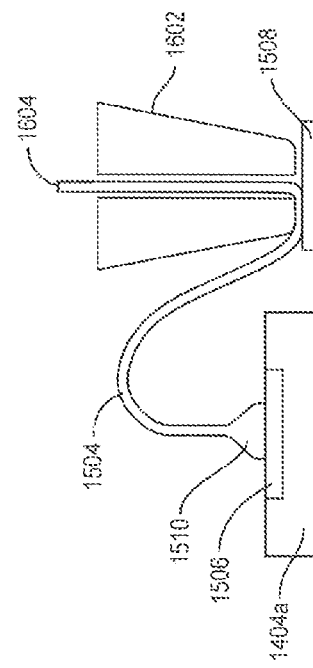

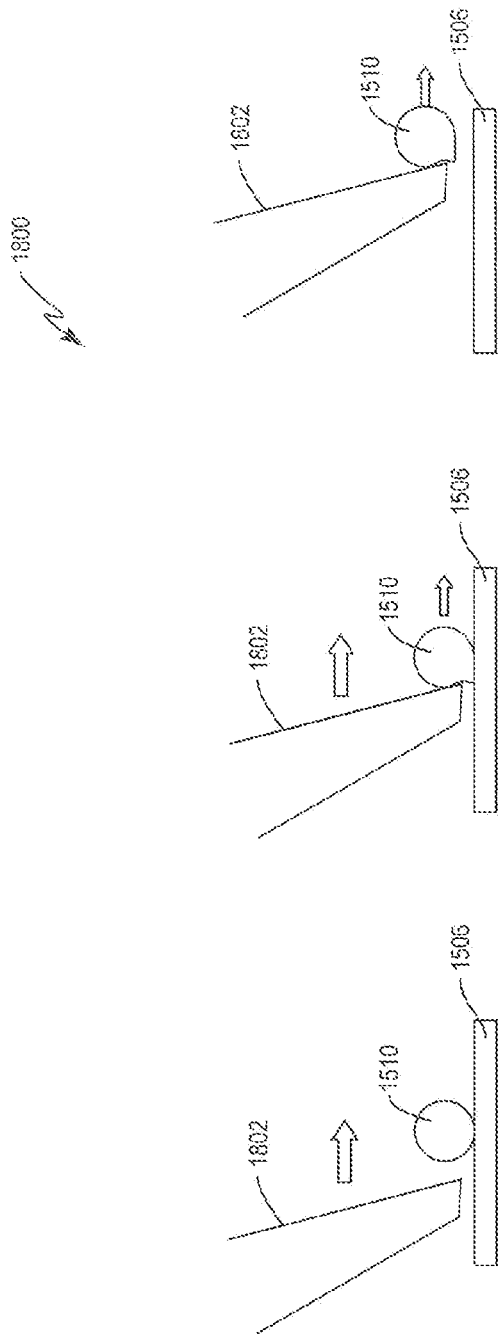

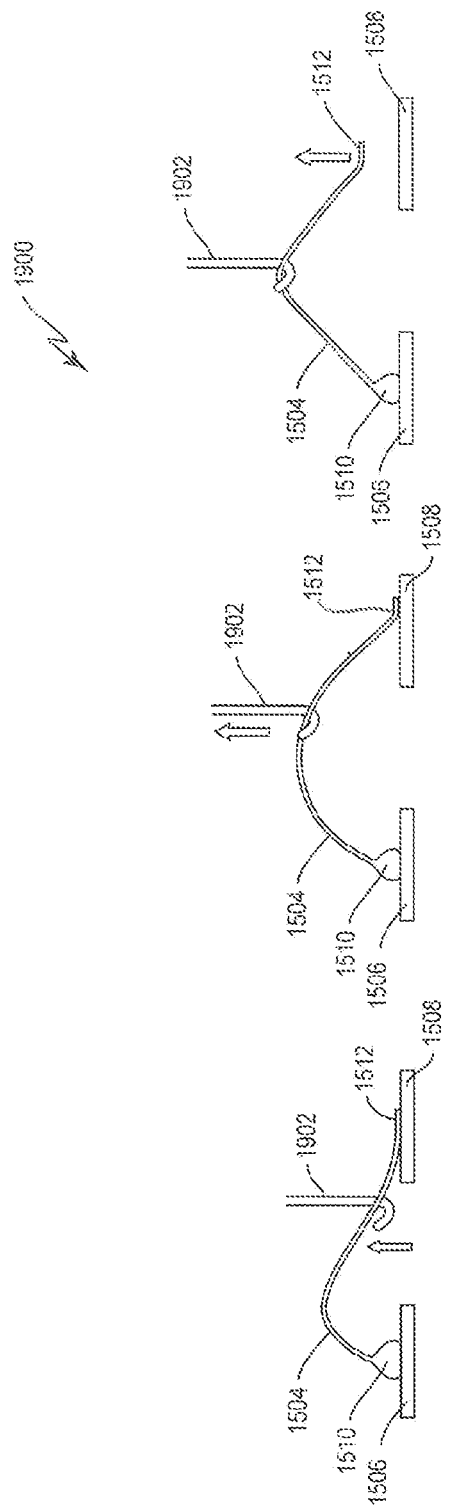

| MODEL TARGET VARIABLE (QA VALUE) | TRAINING DATA | TEST DATA |
|---|---|---|
| BALL SHEAR | 49,114 | 12,280 |
| STITCH PULL | 48,765 | 12,193 |

FIG. 23A

| WIRE NUMBER | HID NUMBER | MEDIAN VALUE (NORMAL) | DELTA VALUE (NORMAL) | DELTA VALUE ABNORMAL |
|---|---|---|---|---|
| 1 | 1 | 11.82 | 0.08 | 0.2 |
| 1 | 2 | 11.70 | -0.09 | 0.12 |
| 2 | 1 | 11.92 | -0.05 | 0.2 |
| 2 | 2 | 11.88 | 0.03 | -0.1 |
| ... | ... | ... | ... | ... |
| N | 1 | 12.20 | 0.20 | 1.2 |
| N | 2 | 12.28 | -0.16 | 1.09 |

FIG. 23B

QUALITY PREDICTION USING PROCESS DATA

CROSS-REFERENCE TO RELATED APPLICATIONS

This application is a continuation of U.S. patent application Ser. No. 17/581,113, which was filed on Jan. 21, 2022, which claims the benefit of, and priority based on, 35 U.S.C. § 119 to U.S. Provisional Application No. 63/223,491, filed Jul. 19, 2021, the disclosures of each of which are incorporated herein by reference in their entirety.

TECHNICAL FIELD

The present disclosure relates generally to computer-generated predictions for bonding operations.

BACKGROUND

Industries, such as manufacturing and construction, use bonding techniques to join materials together (e.g., welding techniques). Quality assurance tests can be used to determine the quality of a bond. For instance, in destructive testing, a subset of bonds are destroyed to make predictions regarding the quality of non-destroyed bonds. In conventional nondestructive testing, testers manually inspect bonds to make predictions regarding the quality of the bond.

SUMMARY

In an example embodiment, a computer-program product tangibly embodied in a non-transitory machine-readable storage medium is provided. The computer-program product includes instructions operable to cause a computing system to access a machine learning model trained on training data of first bonding operations. The first bonding operations comprise operations to bond a first set of multiple wires to a first set of surfaces. The machine learning model is trained by supervised learning comprising receiving the training data. The training data comprises process data generated from measurements of the first bonding operations; and statuses of the multiple wires after bonding to the first set of surfaces. Each status of the statuses comprises one or more candidate outcomes for an objective related to detecting one or more anomalies in the first bonding operations. The machine learning model is trained by supervised learning comprising generating one or more weights for the process data such that the process data input to the machine learning model predicts the one or more candidate outcomes for the objective. The computer-program product includes instructions operable to cause a computing system to receive input data indicating process data generated from measurements of second bonding operations. The second bonding operations comprise operations to bond a second set of multiple wires to a second set of surfaces. The second set of multiple wires are different than the first set of multiple wires. The second set of surfaces are different than the first set of surfaces. The computer-program product includes instructions operable to cause a computing system to weight the input data according to the machine learning model. The computer-program product includes instructions operable to cause a computing system to generate an anomaly predictor indicating a risk for an anomaly occurrence in the second bonding operations based on weighting the input data according to the machine learning model. The computer-program product includes instructions operable to cause a computing system to output the anomaly predictor to control the second bonding operations.

In one or more embodiments, the first bonding operations bond wires of the first set of multiple wires to corresponding surfaces of the first set of surfaces to form integrated circuit chips. The one or more candidate outcomes comprise one or more defective chip outcomes for the integrated circuit chips in the first bonding operations. The instructions are operable to cause the computing system to generate the anomaly predictor for risk of the anomaly in an integrated circuit chip manufacturing process in the second bonding operations.

In one or more embodiments, the instructions are operable to cause the computing system to receive feedback indicating that the anomaly predictor correctly or incorrectly predicted the anomaly in a particular chip manufactured in the second bonding operations. The instructions are operable to cause the computing system to update the machine learning model based on the feedback.

In one or more embodiments, the second bonding operations are performed by a chip manufacturing system. The instructions are operable to cause the computing system to adjust bonding operations subsequent to the second bonding operations by the chip manufacturing system based on one or more of: the anomaly predictor indicating the risk for the anomaly occurrence in the second bonding operations; and feedback indicating that the anomaly predictor correctly or incorrectly predicted the anomaly occurrence in a particular chip manufactured in the second bonding operations.

In one or more embodiments, the instructions are operable to cause the computing system to receive the training data by selectively choosing a subset of parameter types observed in the first bonding operations. The measurements of the first bonding operations are measurements for the subset of parameter types.

In one or more embodiments, the training data comprises the process data generated by deriving information from multiple different measurement types accounting for a relationship between measurement types in the first bonding operations. The instructions are operable to receive the input data indicating the process data generated from measurements of the second bonding operations by deriving information from multiple measurement types accounting for a relationship between measurement types in the second bonding operations.

Embodiments herein also include corresponding computer-program product, apparatus, and methods.

For instance, in one embodiment, a computer-program product tangibly embodied in a non-transitory machine-readable storage medium is provided. The computer-program product includes instructions operable to cause a computing system to train a machine learning model by receiving the training data. The training data comprises process data generated from measurements of the first bonding operations; and statuses of the multiple wires after bonding to the first set of surfaces. Each status of the statuses comprises one or more candidate outcomes for an objective related to detecting one or more anomalies in the first bonding operations. The computer-program product includes instructions operable to cause a computing system to train a machine learning model by generating one or more weights for the process data such that the process data input to the machine learning model predicts the one or more candidate outcomes for the objective.

In another example embodiment, a computing device is provided. The computing device includes, but is not limited to, a processor and memory. The memory contains instructions that when executed by the processor control the computing device to access a machine learning model trained on training data of first bonding operations. The first bonding operations comprise operations to bond a first set of multiple wires to a first set of surfaces. The machine learning model is trained by supervised learning comprising receiving the training data. The training data comprises process data generated from measurements of the first bonding operations; and statuses of the multiple wires after bonding to the first set of surfaces. Each status of the statuses comprises one or more candidate outcomes for an objective related to detecting one or more anomalies in the first bonding operations. The machine learning model is trained by supervised learning comprising generating one or more weights for the process data such that the process data input to the machine learning model predicts the one or more candidate outcomes for the objective. The memory contains instructions that when executed by the processor control the computing device to receive input data indicating process data generated from measurements of second bonding operations. The second bonding operations comprise operations to bond a second set of multiple wires to a second set of surfaces. The second set of multiple wires are different than the first set of multiple wires. The second set of surfaces are different than the first set of surfaces. The computer-program product includes instructions operable to cause a computing device to weight the input data according to the machine learning model. The memory contains instructions that when executed by the processor control the computing device to generate an anomaly predictor indicating a risk for an anomaly occurrence in the second bonding operations based on weighting the input data according to the machine learning model. The memory contains instructions that when executed by the processor control the computing device to output the anomaly predictor to control the second bonding operations.

In another example embodiment, a computing device is provided. The computing device includes, but is not limited to, a processor and memory. The memory contains instructions that when executed by the processor control the computing device to train a machine learning model by receiving training data. The training data comprises process data generated from measurements of first bonding operations; and statuses of multiple wires after bonding to a first set of surfaces. Each status of the statuses comprises one or more candidate outcomes for an objective related to detecting one or more anomalies in the first bonding operations. The computer-program product includes instructions operable to cause a computing device to train a machine learning model by generating one or more weights for the process data such that the process data input to the machine learning model predicts the one or more candidate outcomes for the objective.

In one or more embodiments, a computing device is a computing system or is part of a computing system.

In another example embodiment, a computer-implemented method, is provided. The method comprises accessing a machine learning model trained on training data of first bonding operations. The first bonding operations comprise operations to bond a first set of multiple wires to a first set of surfaces. The machine learning model is trained by supervised learning comprising receiving the training data. The training data comprises process data generated from measurements of the first bonding operations; and statuses of the multiple wires after bonding to the first set of surfaces. Each status of the statuses comprises one or more candidate outcomes for an objective related to detecting one or more anomalies in the first bonding operations. The machine learning model is trained by supervised learning comprising generating one or more weights for the process data such that the process data input to the machine learning model predicts the one or more candidate outcomes for the objective. The method comprises receiving input data indicating process data generated from measurements of second bonding operations. The second bonding operations comprise operations to bond a second set of multiple wires to a second set of surfaces. The second set of multiple wires are different than the first set of multiple wires. The second set of surfaces are different than the first set of surfaces. The method comprises weighting the input data according to the machine learning model. The method comprises generating an anomaly predictor indicating a risk for an anomaly occurrence in the second bonding operations based on weighting the input data according to the machine learning model. The method comprises outputting the anomaly predictor to control the second bonding operations.

In another example embodiment, a computer-implemented method, is provided. The method comprises training a machine learning model by receiving training data. The training data comprises process data generated from measurements of first bonding operations; and statuses of multiple wires after bonding to a first set of surfaces. Each status of the statuses comprises one or more candidate outcomes for an objective related to detecting one or more anomalies in the first bonding operations. The method comprises training a machine learning model by generating one or more weights for the process data such that the process data input to the machine learning model predicts the one or more candidate outcomes for the objective.

In any of these computer program product, apparatus, and methods, the one or more candidate outcomes can comprise one or more destructive quality assurance tests for individual wires or bonds in the first bonding operations. The anomaly predictor can be a predictor of an anomaly in an individual wire or bond in the second bonding operations without performing a destructive quality assurance test on the individual wire or bond.

In any of these computer program product, apparatus, and methods, the first bonding operations can comprise one of: ball bonding operations where the destructive quality assurance tests comprise a ball shear test for testing a ball bond; and stitch bonding operations where the destructive quality assurance tests comprise a stitch pull test for testing a stitch bond.

In any of these computer program product, apparatus, and methods, the one or more anomalies can be associated with one or more of: floating condition; lead frame contamination; and die tilt.

In any of these computer program product, apparatus, and methods, the second bonding operations can bond wires of the second set of multiple wires to form integrated circuit chips. The process data generated from the measurements of the second bonding operations can pertain holistically to a particular chip of the integrated circuit chips and is derived from measurement data for wires associated with the particular chip and bonded in the second bonding operations.

In any of these computer program product, apparatus, and methods, the input data can comprise real-time sensor measurements received during the second bonding operations. For a given wire of the second set of multiple wires, the sensor measurements can comprise one or more of: heat measurements; power measurements; force measurements; electric flame-off (EFO) measurements; and ultrasonic measurements.

In any of these computer program product, apparatus, and methods, the input data can comprise real-time sensor measurements received during the second bonding operations. The sensor measurements can comprise measurements of a bonding system involved in the second bonding operations. The anomaly predictor can control the second bonding operations to correct the one or more anomalies and/or reduce the occurrence of the one or more anomalies in the bonding system involved in the second bonding operations.

In any of these computer program product, apparatus, and methods, the input data can comprise received sensor measurements tagged with origin information indicating one or more of an identity or location for a particular wire, die, or chip involved in the second bonding operations. The anomaly predictor can identify the anomaly that occurred in the second bonding operations and is correlated with the origin information to indicate the location of the anomaly.

In any of these computer program product, apparatus, and methods, the input data can include derived data comprising one or more of: a generated value indicating a median or average value for measurements pertaining to multiple wires bonded in a particular chip in the second bonding operations; a generated set of deviations comprising a deviation from the value for each of the multiple wires; and a generated metric for the chip accounting for the set of deviations.

In any of these computer program product, apparatus, and methods, the training data can comprise the process data generated from derived data comprising a generated singular data value correlated with multiple different types of measurements and pertaining to a same wire in the first bonding operations. The input data indicating the process data generated from measurements of the second bonding operations can comprise a generated singular data value. The generated singular data value can be correlated with the multiple different types of measurements and pertain to a same wire in the second bonding operations.

In any of these computer program product, apparatus, and methods, the one or more weights for the process data can be generated for a gradient boosting model of the training data.

In any of these computer program product, apparatus, and methods, the machine learning model can be further trained by multiple generated machine learning models and is selected based on k-fold cross-validation.

In any of these computer program product, apparatus, and methods, the measurements of the first and second bonding operations can comprise measurements associated with a process of forming ball bonds.

In any of these computer program product, apparatus, and methods, the measurements of the first and second bonding operations can comprise measurements associated with a process of forming stitch bonds.

In any of these computer program product, apparatus, and methods, the anomaly predictor can be a predictor of a defective bond between a wire of the second set of multiple wires and a lead frame or die of the second set of surfaces.

Other features and aspects of example embodiments are presented below in the Detailed Description when read in connection with the drawings presented with this application.

BRIEF DESCRIPTION OF THE DRAWINGS

FIGS. 15A and 15B illustrate some example components of an integrated circuit chip and respective bondings according to at least one embodiment of the present technology.

FIGS. 16A-16D illustrate an example bonding operation involved in manufacturing an integrated circuit chip according to at least one embodiment of the present technology.

FIGS. 18A-18C illustrate a destructive ball shear testing procedure for a ball bond.

FIGS. 19A-19C illustrate a destructive stitch pull testing procedure for a stitch bond.

FIG. 23A illustrates example Quality Assurance (QA) data comparing the training data and the test data for predictive models for destructive testing of the bonds formed during bonding operations.

FIG. 23B illustrates an example method for generating a derived processing data according to at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
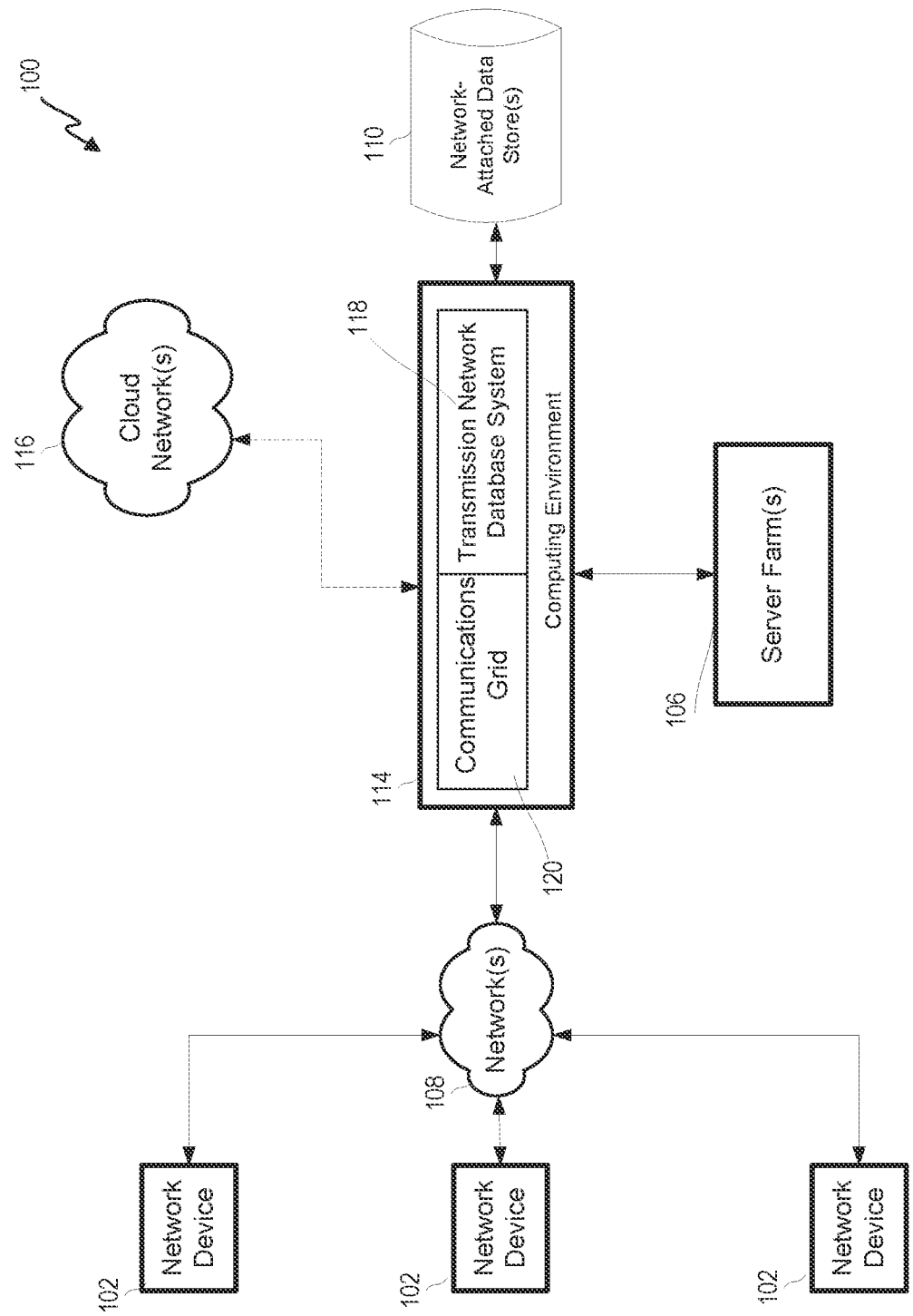
FIG. 1 illustrates a block diagram that provides an illustration of the hardware components of a computing system, according to at least one embodiment of the present technology.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
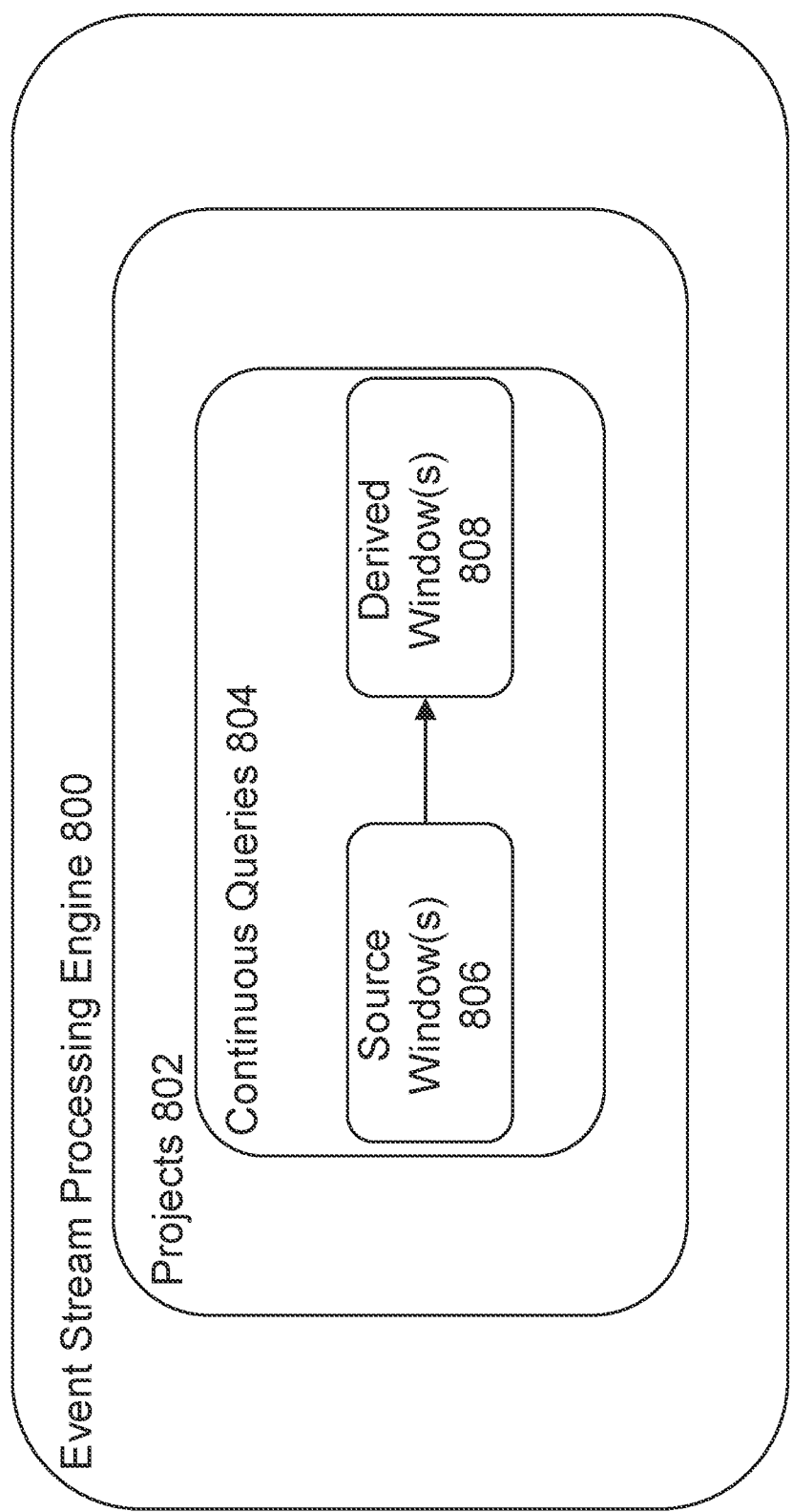
FIG. 8 illustrates a block diagram including components of an Event Stream Processing Engine (ESPE), according to at least one embodiment of the present technology.
Figure 9:
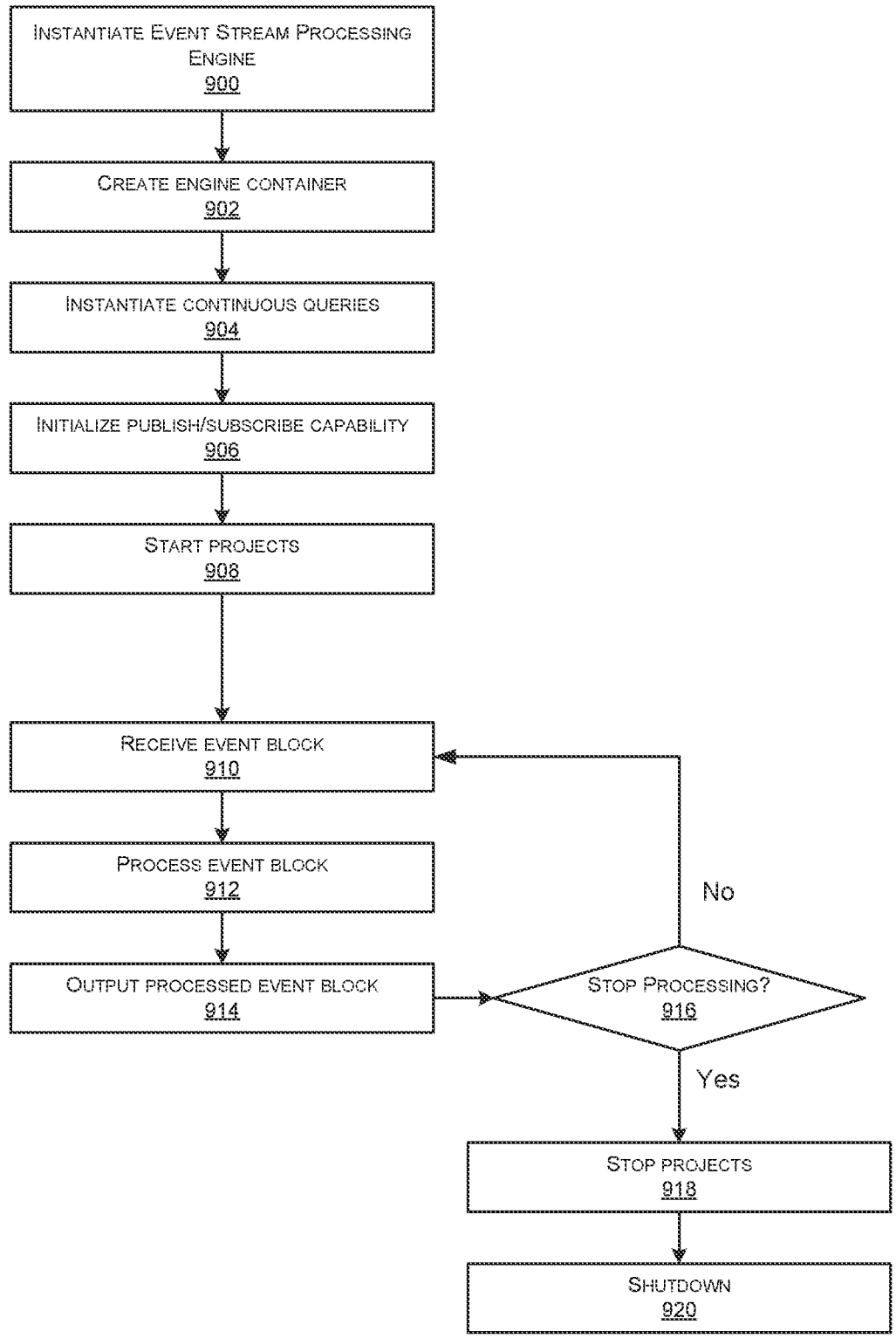
FIG. 9 illustrates a flow chart showing an example process including operations performed by an event stream processing engine, according to at least one embodiment of the present technology.
Figure 10:
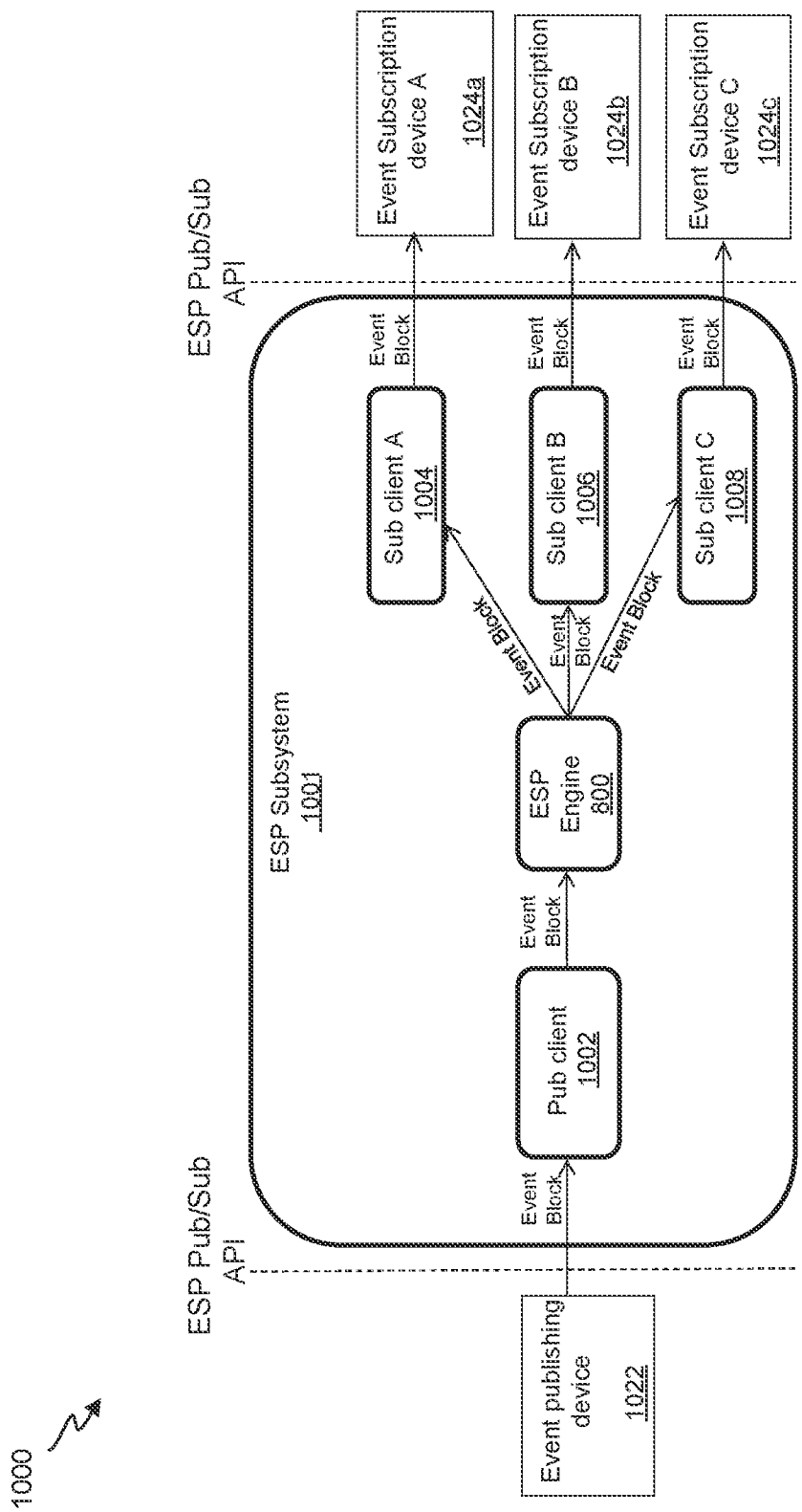
FIG. 10 illustrates an ESP system interfacing between a publishing device and multiple event subscribing devices, according to at least one embodiment of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However, in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users. The cloud network 116 may include one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or a remote server may include a server stack. As another example, data may be processed as part of computing environment 114.

Each communication within data transmission network 100 (e.g., between client devices, between a device and connection management system, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a Bluetooth or a Bluetooth Low Energy channel. A wired network may include a wired interface. The wired and/or wireless networks may be implemented using routers, access points, bridges, gateways, or the like, to connect devices in the network 108, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. IoT may be implemented in various areas, such as for access (technologies that get data and move it), embed-ability (devices with embedded sensors), and services. Industries in the IoT space may include automotive (connected car), manufacturing (connected factory), smart cities, energy and retail. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
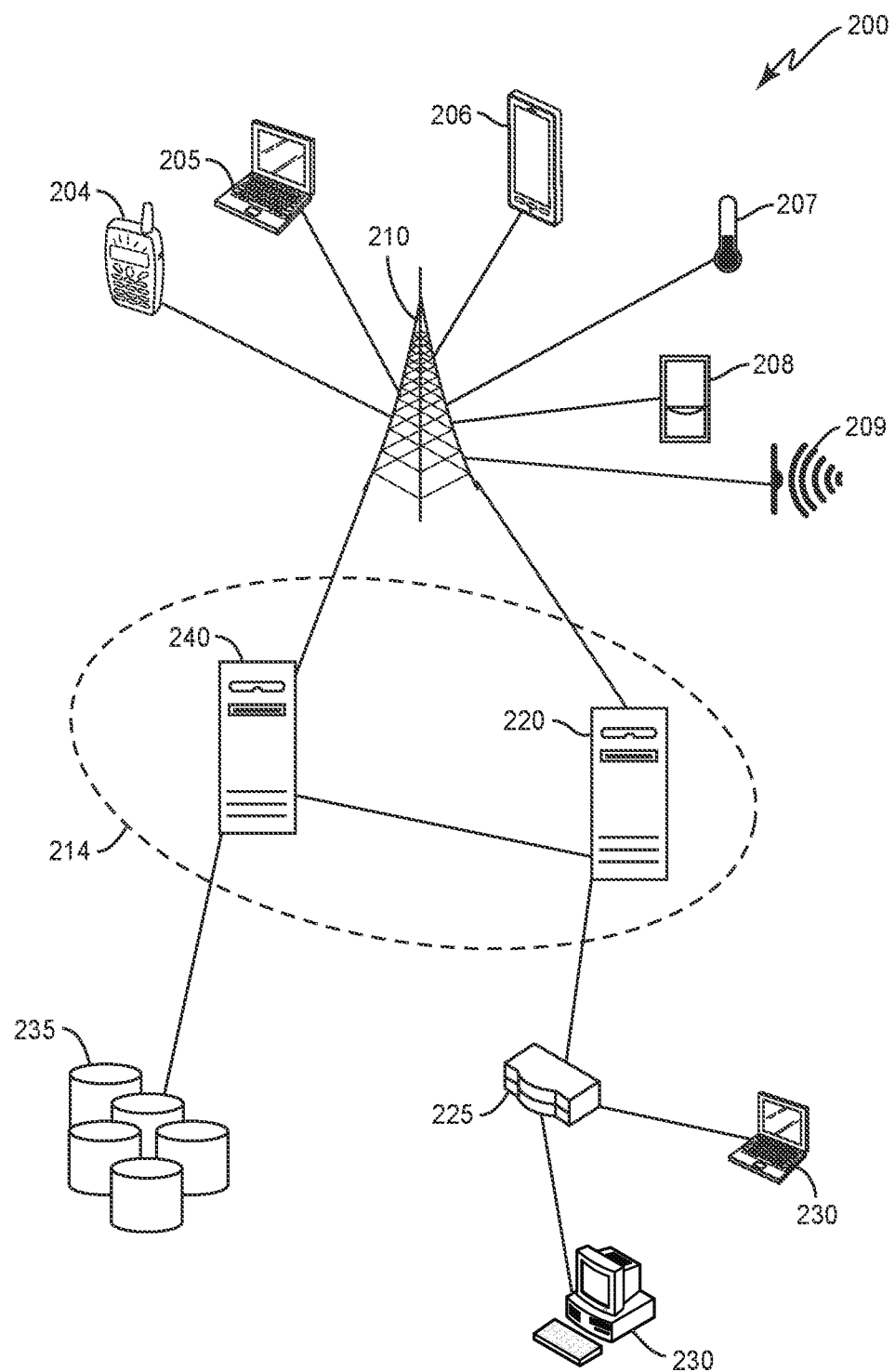
FIG. 2 illustrates an example network including an example set of devices communicating with each other over an exchange system and via a network, according to at least one embodiment of the present technology.

FIG. 2 illustrates an example network including an example set of devices communicating with each other over an exchange system and via a network, according to embodiments of the present technology. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, electrical current, among others. The sensors may be mounted to various components used as part of a variety of different types of systems (e.g., an oil drilling operation). The network devices may detect and record data related to the environment that it monitors and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
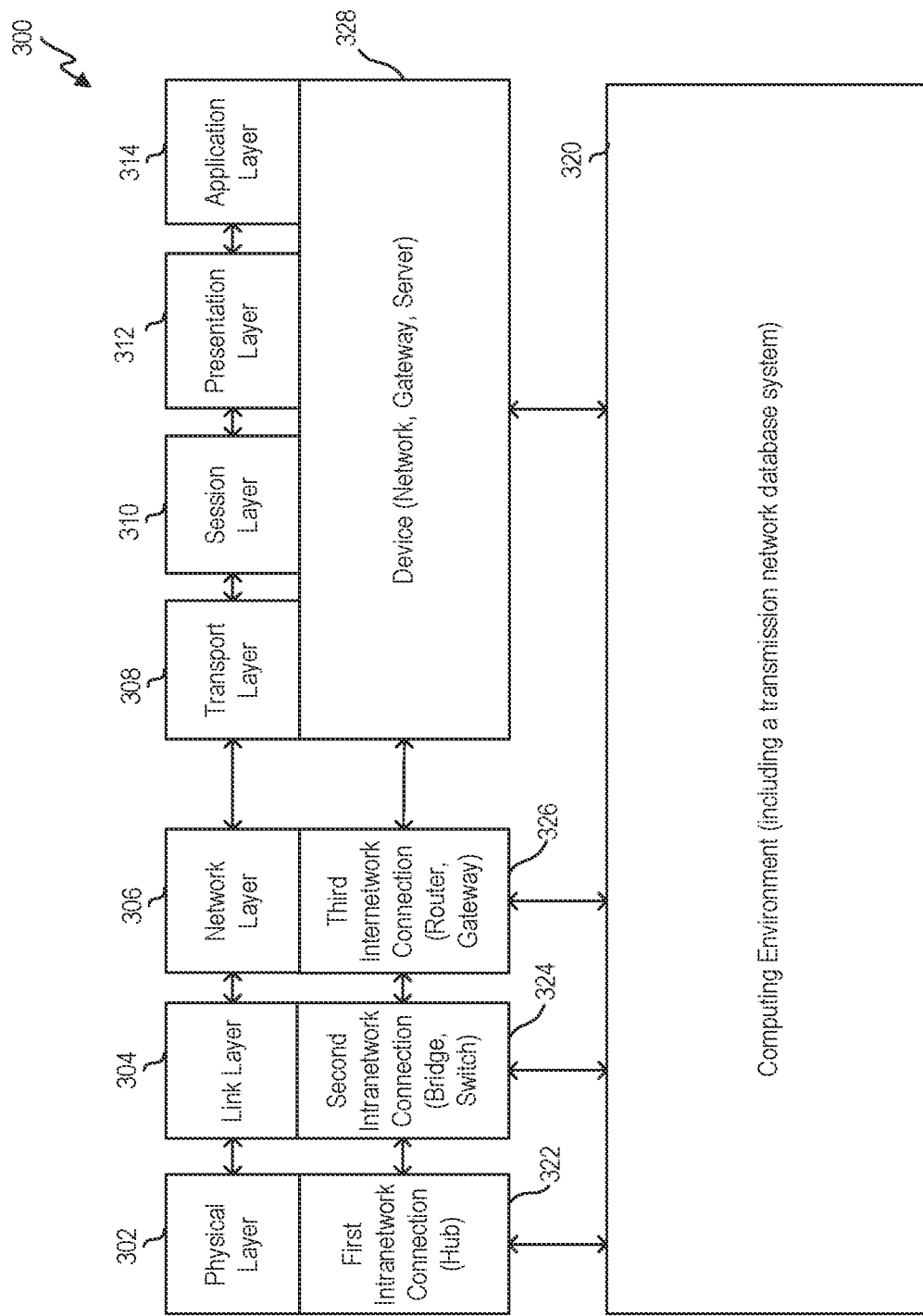
FIG. 3 illustrates a representation of a conceptual model of a communications protocol system, according to at least one embodiment of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 320 (or computing environment 214 in FIG. 2) may communicate with other devices in its network, and control how communications between the computing environment and other devices are executed and under what conditions.

The model can include layers 302-314. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bytes of data and is the farthest layer from the user in a communications system. On the other hand, the application layer is the highest layer because it interacts directly with a software application.

As noted, the model includes a physical layer 302. Physical layer 302 represents physical communication and can define parameters of that physical communication. For example, such physical communication may come in the form of electrical, optical, or electromagnetic signals. Physical layer 302 also defines protocols that may control communications within a data transmission network.

Link layer 304 defines links and mechanisms used to transmit (i.e., move) data across a network. The link layer manages node-to-node communications, such as within a grid computing environment. Link layer 304 can detect and correct errors (e.g., transmission errors in the physical layer 302). Link layer 304 can also include a media access control (MAC) layer and logical link control (LLC) layer.

Network layer 306 defines the protocol for routing within a network. In other words, the network layer coordinates transferring data across nodes in a same network (e.g., such as a grid computing environment). Network layer 306 can also define the processes used to structure local addressing within the network.

Transport layer 308 can manage the transmission of data and the quality of the transmission and/or receipt of that data. Transport layer 308 can provide a protocol for transferring data, such as, for example, a Transmission Control Protocol (TCP). Transport layer 308 can assemble and disassemble data frames for transmission. The transport layer can also detect transmission errors occurring in the layers below it.

Session layer 310 can establish, maintain, and manage communication connections between devices on a network. In other words, the session layer controls the dialogues or nature of communications between network devices on the network. The session layer may also establish checkpointing, adjournment, termination, and restart procedures.

Presentation layer 312 can provide translation for communications between the application and network layers. In other words, this layer may encrypt, decrypt and/or format data based on data types known to be accepted by an application or network layer.

Application layer 314 interacts directly with software applications and end users, and manages communications between them. Application layer 314 can identify destinations, local resource states or availability and/or communication content or formatting using the applications.

Intra-network connection components 322 and 324 are shown to operate in lower levels, such as physical layer 302 and link layer 304, respectively. For example, a hub can operate in the physical layer and a switch can operate in the link layer. Inter-network connection components 326 and 328 are shown to operate on higher levels, such as layers 306-314. For example, routers can operate in the network layer and network devices can operate in the transport, session, presentation, and application layers.

As noted, a computing environment 320 can interact with and/or operate on, in various embodiments, one, more, all or any of the various layers. For example, computing environment 320 can interact with a hub (e.g., via the link layer) so as to adjust which devices the hub communicates with. The physical layer may be served by the link layer, so it may implement such data from the link layer. For example, the computing environment 320 may control which devices it will receive data from. For example, if the computing environment 320 knows that a certain network device has turned off, broken, or otherwise become unavailable or unreliable, the computing environment 320 may instruct the hub to prevent any data from being transmitted to the computing environment 320 from that network device. Such a process may be beneficial to avoid receiving data that is inaccurate or that has been influenced by an uncontrolled environment. As another example, computing environment 320 can communicate with a bridge, switch, router or gateway and influence which device within the system (e.g., system 200) the component selects as a destination. In some embodiments, computing environment 320 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 320 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
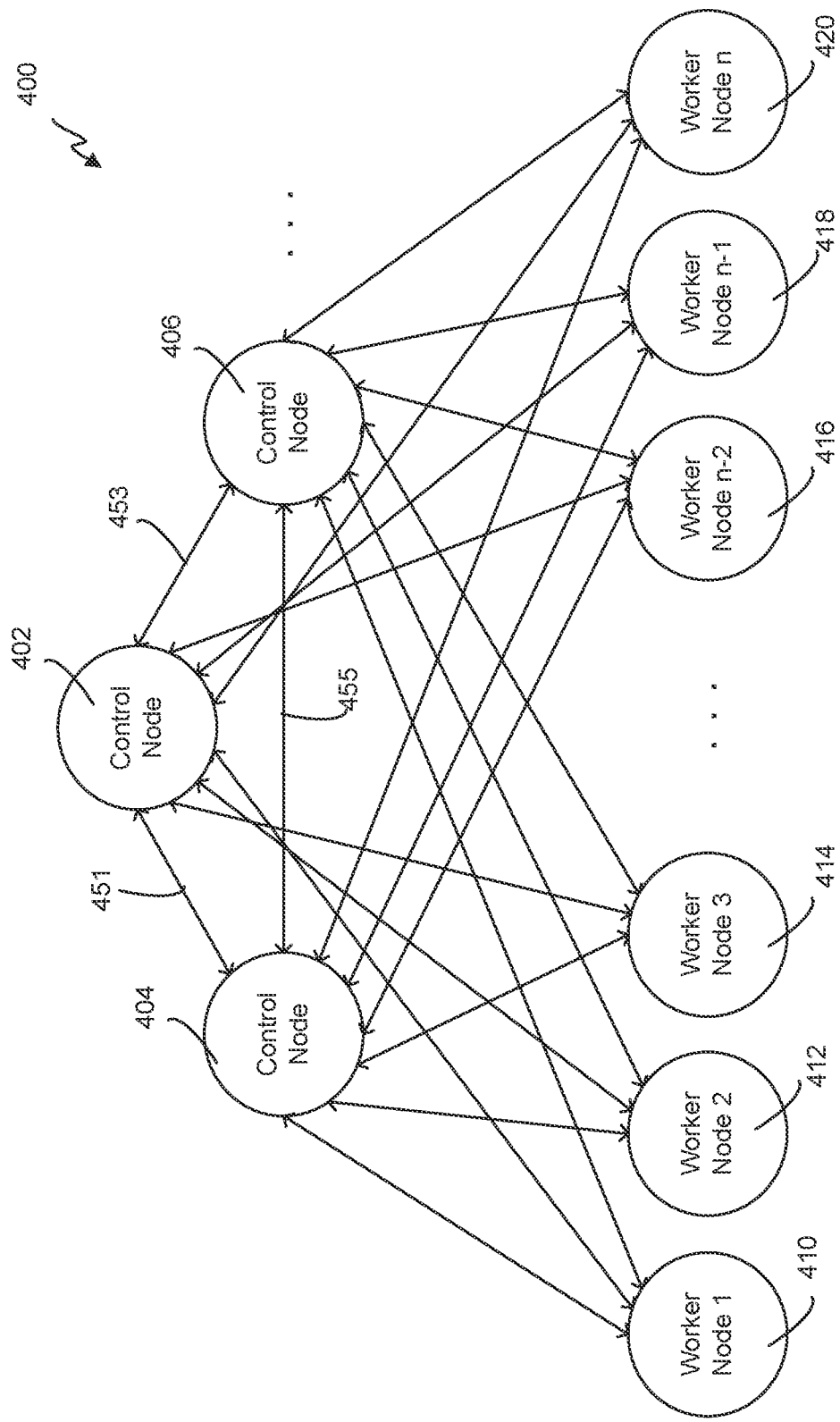
FIG. 4 illustrates a communications grid computing system including a variety of control and worker nodes, according to at least one embodiment of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it, and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be received or stored by a machine other than a control node (e.g., a Hadoop data node).

Control nodes may maintain knowledge of the status of the nodes in the grid (i.e., grid status information), accept work requests from clients, subdivide the work across worker nodes, coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes. The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID).

This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may be sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed.

Figure 5:
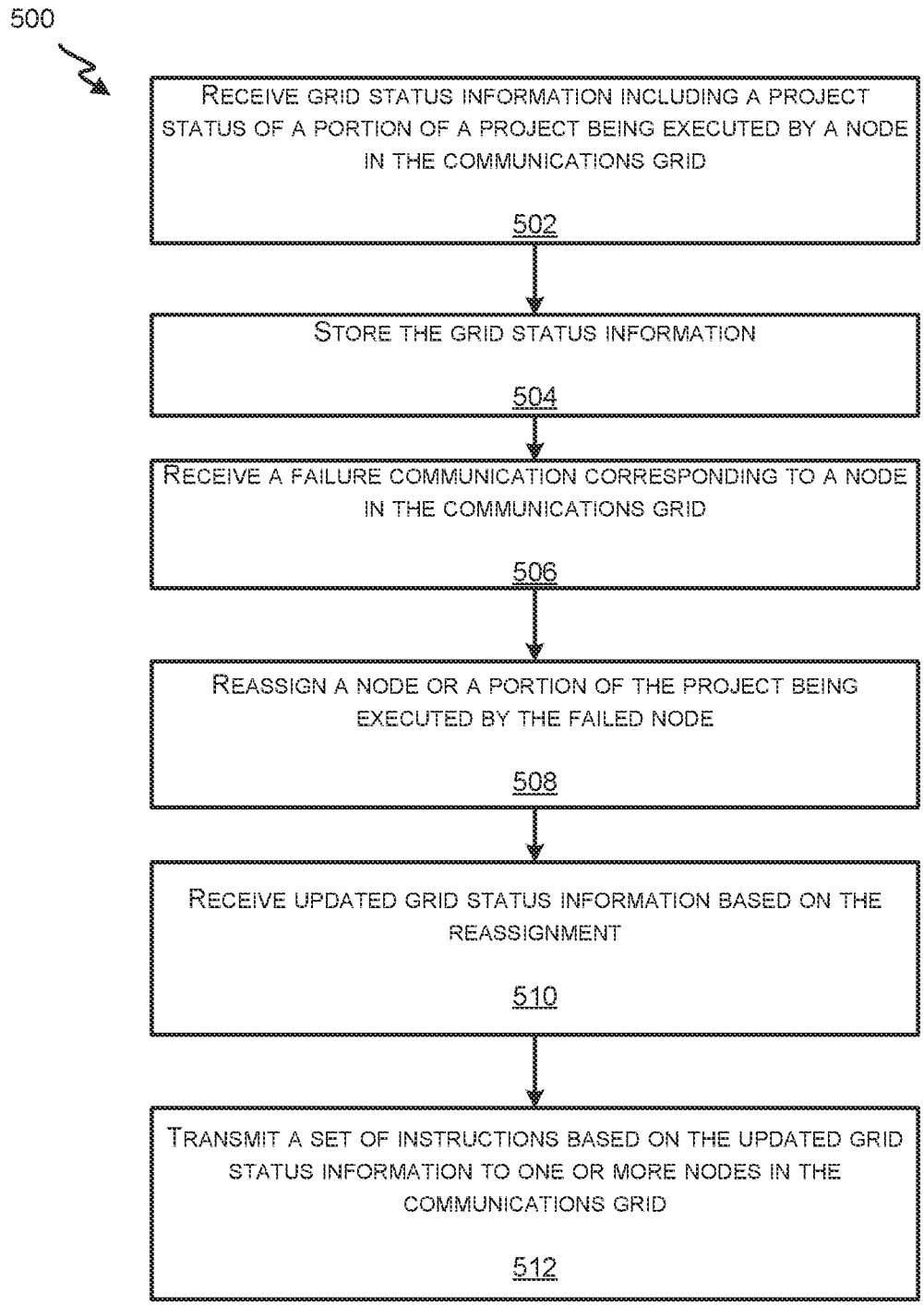
FIG. 5 illustrates a flow chart showing an example process for adjusting a communications grid or a work project in a communications grid after a failure of a node, according to at least one embodiment of the present technology.

FIG. 5 illustrates a flow chart 500 showing an example process for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
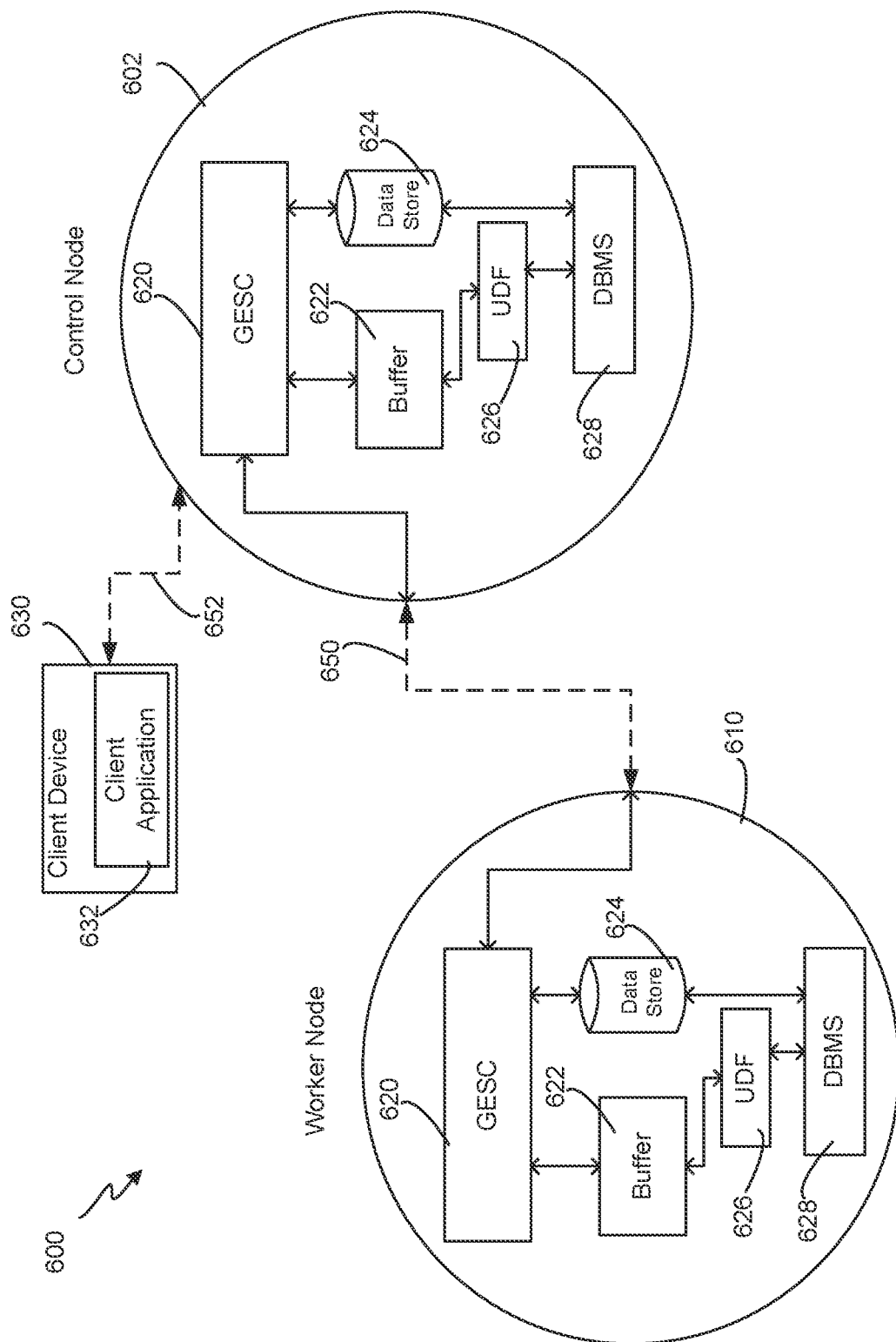
FIG. 6 illustrates a portion of a communications grid computing system including a control node and a worker node, according to at least one embodiment of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration but may include more worker and/or control nodes. The control node 602 is communicatively connected to worker node 610 via communication path 650. Therefore, control node 602 may transmit information (e.g., related to the communications grid or notifications), to and receive information from worker node 610 via path 650.

Similar to in FIG. 4, communications grid computing system (or just "communications grid") 600 includes data processing nodes (control node 602 and worker node 610). Nodes 602 and 610 include multi-core data processors. Each node 602 and 610 includes a grid-enabled software component (GESC) 620 that executes on the data processor associated with that node and interfaces with buffer memory 622 also associated with that node. Each node 602 and 610 includes a database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However, in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DBMS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 610 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DBMS 628 may control the creation, maintenance, and use of database or data structure (not shown) within a node 602 or 610. The database may organize data stored in data stores 624. The DBMS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
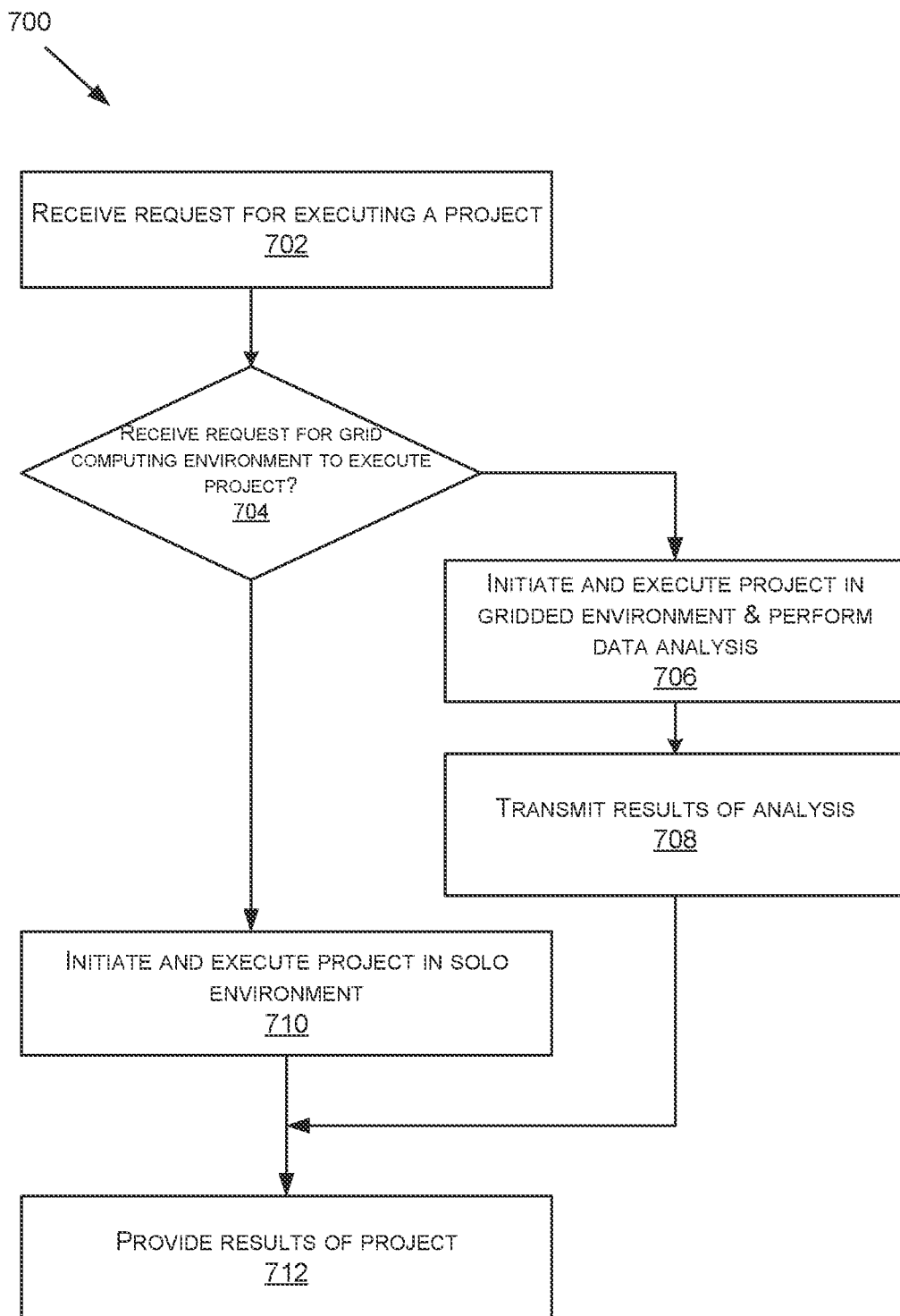
FIG. 7 illustrates a flow chart showing an example process for executing a data analysis or processing project, according to at least one embodiment of the present technology.

FIG. 7 illustrates a flow chart 700 showing an example method for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project in operation 712.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop-down menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024*a*-*c*, according to embodiments of the present technology. ESP system 1000 may include ESP device or subsystem 1001, event publishing device 1022, an event subscribing device A 1024*a*, an event subscribing device B 1024*b*, and an event subscribing device C 1024*c*. Input event streams are output to ESP device 1001 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024*a*, event subscribing device B 1024*b*, and event subscribing device C 1024*c*. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024*a*, event subscribing device B 1024*b*, and event subscribing device C 1024*c*, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024*a*, event subscribing device B 1024*b*, and event subscribing device C 1024*c*.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 1001 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024*a* using the publish/subscribe API. Subscribing client B 1006 may be started by an event subscription application B executing at event subscribing device B 1024*b* using the publish/subscribe API. Subscribing client C 1008 may be started by an event subscription application C executing at event subscribing device C 1024c using the publish/subscribe API.

An event block object containing one or more event objects is injected into a source window of the one or more source windows 806 from an instance of an event publishing application on event publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024a, event subscription device B 1024b, and event subscription device C 1024c. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024a-c. For example, subscribing client A 1004, subscribing client B 1006, and subscribing client C 1008 may send the received event block object to event subscription device A 1024a, event subscription device B 1024b, and event subscription device C 1024c, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
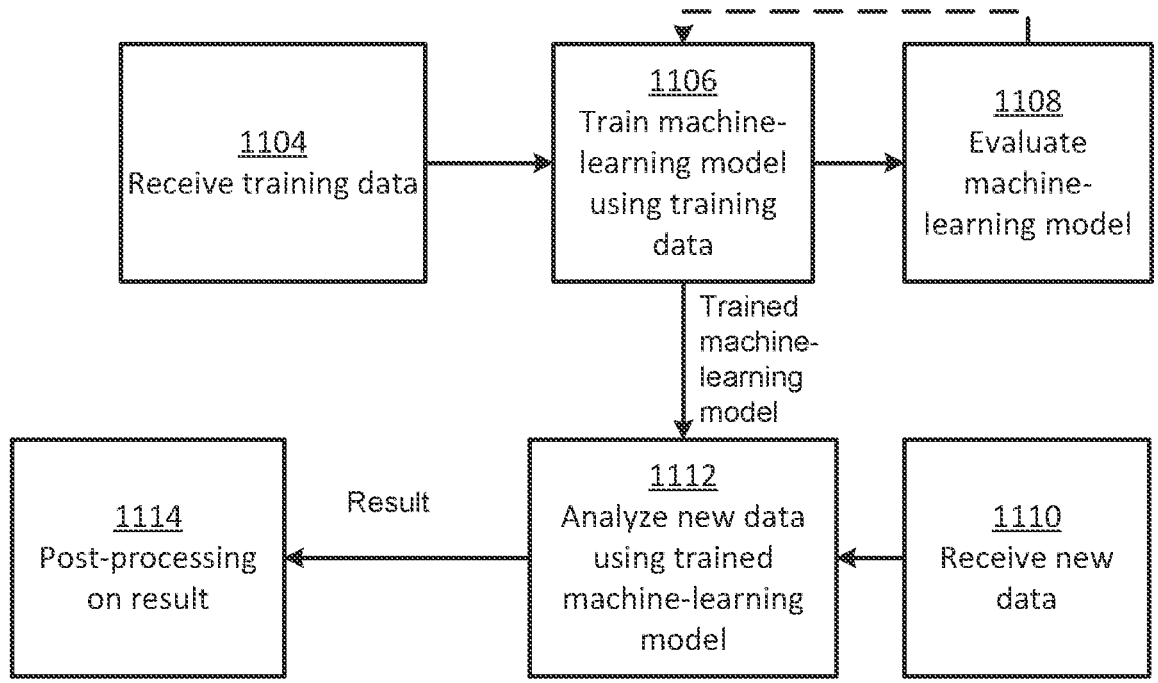
FIG. 11 illustrates a flow chart of an example of a process for generating and using a machine-learning model according to at least one embodiment of the present technology.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Nave bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, N.C.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1104, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1106, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1108, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 1106, where the machine-learning model can be further trained using additional training data or otherwise modified to improve accuracy. If the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
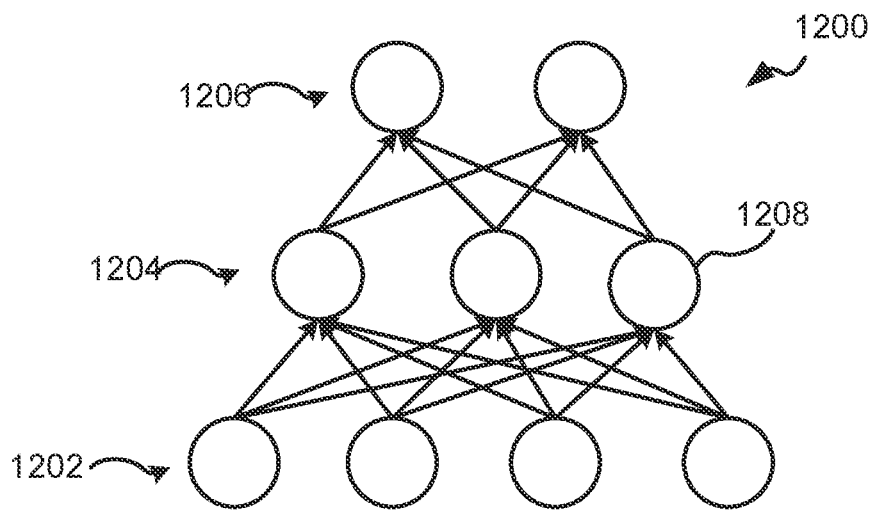
FIG. 12 illustrates an example of a machine-learning model as a neural network according to at least one embodiment of the present technology.

A more specific example of a machine-learning model is the neural network 1200 shown in FIG. 12. The neural network 1200 is represented as multiple layers of interconnected neurons, such as neuron 1208, that can exchange data between one another. The layers include an input layer 1202 for receiving input data, a hidden layer 1204, and an output layer 1206 for providing a result. The hidden layer 1204 is referred to as hidden because it may not be directly observable or have its input directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons and connections between the neurons can have numeric weights, which can be tuned during training. For example, training data can be provided to the input layer 1202 of the neural network 1200, and the neural network 1200 can use the training data to tune one or more numeric weights of the neural network 1200. In some examples, the neural network 1200 can be trained using backpropagation. Backpropagation can include determining a gradient of a particular numeric weight based on a difference between an actual output of the neural network 1200 and a desired output of the neural network 1200. Based on the gradient, one or more numeric weights of the neural network 1200 can be updated to reduce the difference, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, every neuron only propagates an output value to a subsequent layer of the neural network 1200. For example, data may only move one direction (forward) from one neuron to the next neuron in a feed-forward neural network.

In other examples, the neural network 1200 is a recurrent neural network. A recurrent neural network can include one or more feedback loops, allowing data to propagate in both forward and backward through the neural network 1200. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer of the neural network 1200. Each subsequent layer of the neural network 1200 can repeat this process until the neural network 1200 outputs a final result at the output layer 1206. For example, the neural network 1200 can receive a vector of numbers as an input at the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the following equation:

$$y = \max(x, 0)$$

where y is the output and x is an input value from the weighted vector. The transformed output can be supplied to a subsequent layer, such as the hidden layer 1204 of the neural network 1200. The subsequent layer of the neural network 1200 can receive the transformed output, multiply the transformed output by a matrix of numeric weights and a nonlinearity, and provide the result to yet another layer of the neural network 1200. This process continues until the neural network 1200 outputs a final result at the output layer 1206.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

One or more embodiments of the present technology are useful for making predictions regarding processes for joining together materials (e.g., bonding operations). There are many different ways to join materials together including adhesive bonding, welding bonding, stitching bonding, and soldering bonding. Bonding operations are used in many different industries including manufacturing and construction. Bonding can be used to manufacturing various products and their packaging, such as vehicles, user equipment, mobile devices, computers, medical devices, clothing, and chemical products. Bonding can be used in construction such as to form buildings, bridges, and electrical systems. In bonding operations, it can be difficult to know the quality of a bond, and consequently the quality of the formed product, without destroying the bond itself. Predictions regarding the bonding operation can be useful for making determinations regarding a bonding operation without destroying manufactured products. For instance, one or more embodiments are useful for manufacturing an integrated computer (IC) chip.

As those of ordinary skill in the art are aware, the semiconductor manufacturing process for an IC chip is typically performed in two stages commonly referred to as the "front-end" and the "back-end." The front-end refers to the manufacturing process for fabricating a silicon wafer from a blank wafer. Once completed, the fabricated silicon wafer has a plurality of IC chips thereon. The "back-end" refers to the manufacturing processes that occur after all the IC chips have been created on the silicon wafer. For purposes of describing example embodiments, example "back-end" processes will be described in greater detail.

Figure 13:
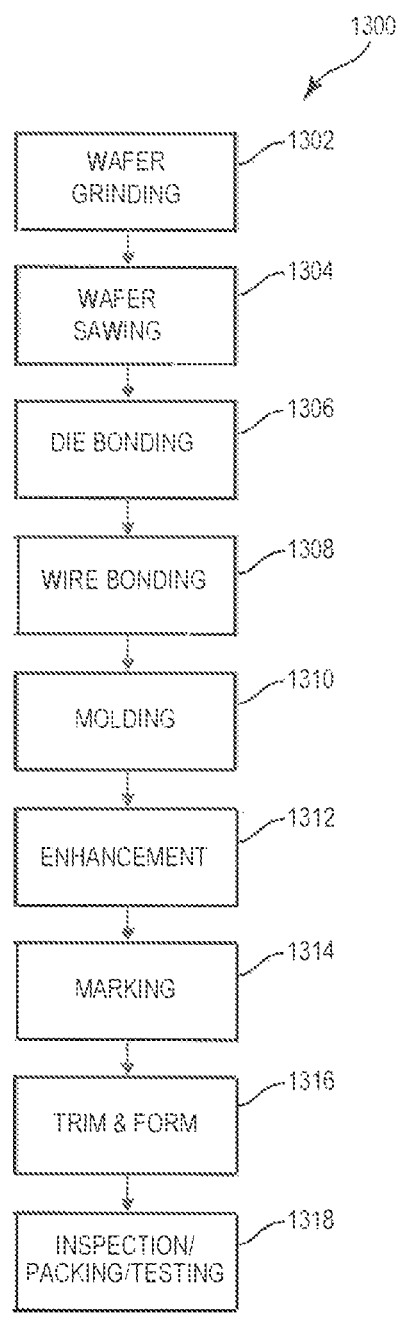
FIGS. 13-14 illustrate example flow diagrams for manufacturing an integrated circuit chip according to at least one embodiment of the present technology.
Figure 14:
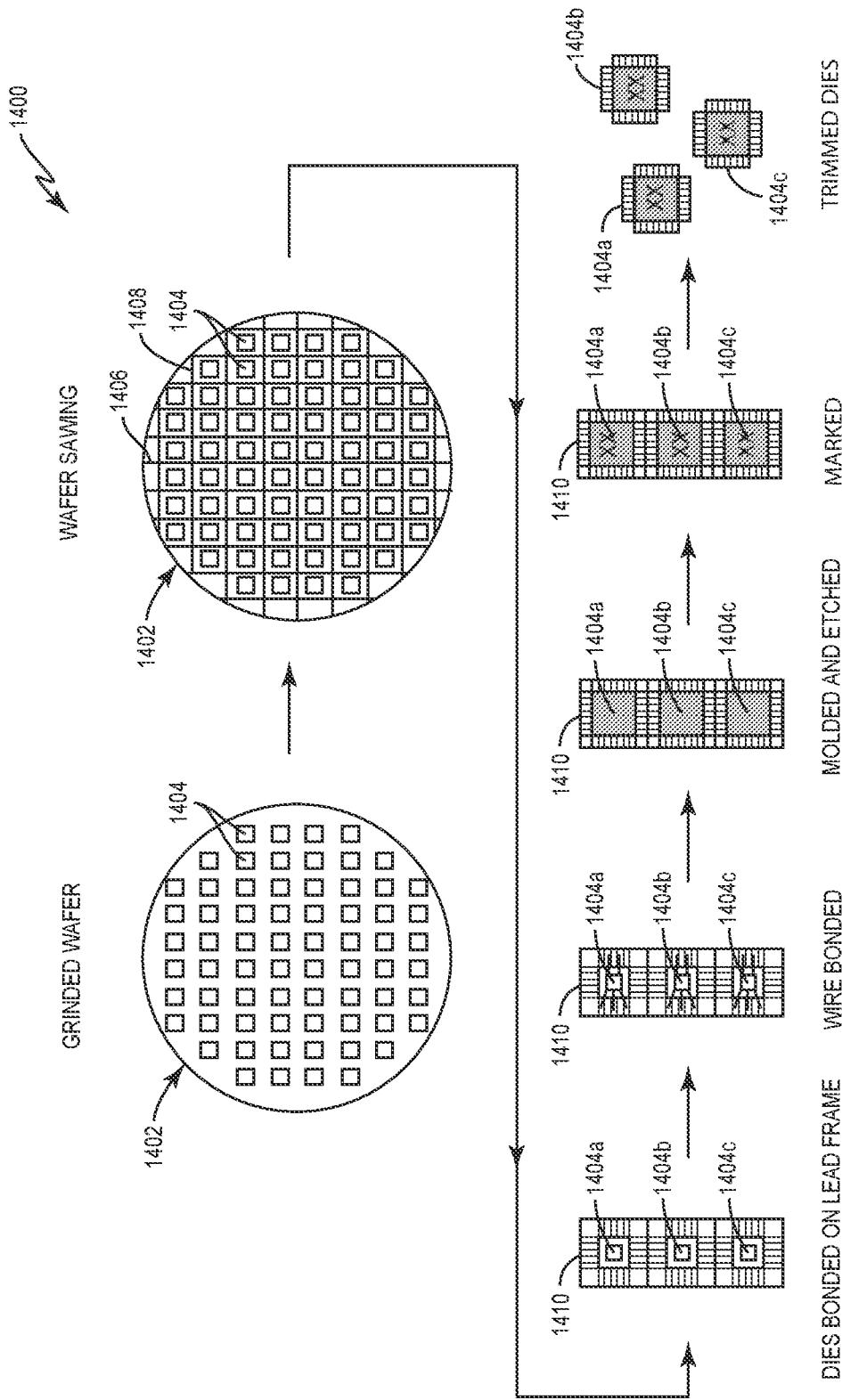

FIGS. 13 and 14 illustrate an overview of an example "back-end" semiconductor manufacturing process for manufacturing an IC chip according to one embodiment. In particular, FIG. 13 illustrates an example method 1300 for performing the "back-end" of the semiconductor manufacturing process. FIG. 14 further graphically illustrates a method 1400 for performing the back-end semiconductor manufacturing process and some of the components associated with the back end of the semiconductor manufacturing process. Such components include, by way of example, a silicon wafer 1402 having a plurality of dies 1404 thereon. Each die 1404 comprises a block of semiconductor material inside an IC chip on which functional circuits are fabricated. Therefore, each die 1404 is a fully functional IC chip that has not yet been packaged.

As seen in FIG. 13, example method 1300 begins with a wafer grinding stage (box 1302). In this stage, the thickness of silicon wafer (e.g., silicon wafer 1402 of FIG. 14) is reduced to a desired thickness (e.g., 50-75 μm) by an abrasive grinding wheel. The grinding may be implemented, for example, in multiple steps. For instance, in a first step, a grinding wheel (not shown) may use a coarse grit to first coarsely grind a silicon wafer (e.g., silicon wafer 1402 of FIG. 14) and remove most its excess thickness. In a second step the grinding wheel may use a different grit (e.g., a much finer grit) to finish grinding the silicon wafer. The finer grit is used to accurately grind the silicon wafer to the desired thickness and to polish the silicon wafer.

Once grinding is complete, method 1300 of FIG. 13 separates the dies (e.g., dies 1404 of FIG. 14) from each other in a wafer sawing stage (box 1304). Wafer sawing, also known as "wafer dicing," is the process by which the die are separated from each other on the silicon wafer (e.g., silicon wafer 1402 of FIG. 14). Generally, wafer dicing is accomplished by mechanically sawing a silicon wafer in the areas that lie between the die. As seen in FIG. 14, example "areas" for sawing are indicated using vertical and horizontal lines 1406, 1408, respectively, and are commonly referred to as "dicing streets" or "scribe lines." The excess areas around the die can be further removed or reduced by additional sawing or grinding.

The separated die (e.g., die 1404 of FIG. 14) are then attached or "bonded" to a lead frame (e.g., lead frame 1410 of FIG. 14) in a die bonding stage of FIG. 13 (box 1306). A "lead frame" can be a metallic (e.g., copper) conductive structure inside a chip package configured to carry signals from the die to the "outside world" or vice versa. In FIG. 14, the die 1404 is bonded to the lead frame 1410 using an epoxy adhesive or solder. Particularly, the epoxy adhesive or solder is placed on the lead frame 1410 in a predetermined pattern. Individual die 1404a, 1404b, 1404c, which were separated from each other in the wafer sawing stage, are then picked and placed onto the dispensed epoxy adhesive or solder and cured. The curing hardens the epoxy or solder so that each die 1404a, 1404b, 1404c remain attached to the lead frame 1410, and so that each die 1404a, 1404b, 1404c achieves the desired mechanical and electrical properties.

Those of ordinary skill in the art will readily appreciate that the present disclosure is not limited solely to the use of an epoxy adhesive or solder for bonding the die 1404 to lead frame 1410. In other embodiments, for example, the die 1404 are bonded to the lead frame 1410 using a well-known thermocompression die bonding technique. Thermocompression die bonding does not use adhesive materials to attach the die 1404 to lead frame 1410. Rather, heat and a force are applied to the die 1404 in order to form a metallic bond with the underlying lead frame 1410.

The next stage in the back-end process of FIG. 13 is the wire bonding stage (box 1308). In this stage, a wire bonding machine (not shown), for example, creates an electrical connection between a die (e.g., die 1404a) and a lead frame (e.g., lead frame 1410) using a plurality of wires. As is described more fully below, each connection involves two bonds referred to herein as "ball bonds" and "stitch bonds." The ball bond is made between a wire and a die, while the stitch bond is made between a lead frame and the wire. Any number of wires can be used in this stage to bond a die to lead frame. For example, depending on the manufacturer, different numbers of wires can be used (e.g., >5, >10, >20 or >100) to electrically connect a die to a lead frame.

Once the wire bonding stage is complete, a molding stage is performed in FIG. 13 (box 1310). This stage helps protect a die (e.g., die 1404) mechanically (e.g., from damage resulting from one or more physical impacts), as well as environmentally (e.g., from particulates and other impurities). As seen in FIG. 14, the molding stage encapsulates the die 1404 by wrapping it in a predetermined material, such as plastic epoxy material, for example. The molding process can be, for example, any of a number of well-known molding methods. For example, in a first method (i.e., a hermetic method), a ceramic plate or metal lid is attached to the die 1404, thereby forming a seal. In a second method, a plastic epoxy material is melted onto die 1404 and cured to form the seal. Regardless of the particular method used in the molding stage, however, the molding compound is cured using heat.

The next stage after the molding stage in FIG. 13 can include an enhancement stage (box 1312). For instance, a plating operation can be used to help protect the lead frame 1410 from corrosion and abrasion by applying a thin layer of metal over the leads of a lead frame (e.g., lead frame 1410) to mechanically and electrically connect and couple the lead frame to an underlying substrate, such as a printed circuit board (PCB), for example. As another example, an etching operation can be used to enhance the electrical conductivity of lead frames.

After the enhancement stage is complete, a marking stage is performed in FIG. 13 (box 1314). In this stage, the manufacturer marks the housing of the IC chip with a variety of identifiers and other distinguishing information, such as the manufacturer's name and logo, the name of the IC chip, a date code, a lot identifier, and the like. Any number of methods, such as ink-based and laser-based methods, for example, can be used to mark the housings. However, in at least one embodiment of the present technology, laser-based methods are preferred. Regardless of the particular method used in the marking stage, though, the markings enable identification of the IC chip and the source and facilitate traceability.

The next stage in the back-end process is the trim & form stage in FIG. 13 (box 1316). In this stage, metallic struts commonly referred to as called "dambars" connecting the leads extending from the housing of the IC chip are cut away. Additionally, the leads are bent or otherwise formed into an appropriate shape for placement onto an underlying substrate. Finally, the trimmed and formed IC chip is inspected, tested, and packaged for distribution in a stage of FIG. 13 (box 1318).

FIGS. 13 and 14 show example stages that can be performed as part of a semiconductor manufacturing process. Each stage could have one or more operations. Further, different, more, or fewer stages could be performed (e.g., stages could be combined or in different order). Thus, the methods 1300 and 1400 illustrated in FIGS. 13 and 14 are merely examples for describing an example bonding operation for an IC chip. Regardless, as previously described, a wire bonding machine can use a plurality of wires to create the electrical connection between the die 1404 and the lead frame 1410 of FIG. 14 in the wire bonding stage (box 1308). FIGS. 15A and 15B illustrate an example of some of the components of an IC chip 1520 and bondings according to at least one embodiment of the present technology. Particularly, FIGS. 15A and 15B illustrate an exemplary lead frame 1410 bonded to an underlaying substrate 1500. Also attached to substrate 1500 are the conductive "legs" or "pins" of lead frame 1410. In this embodiment, FIG. 15A illustrates lead frame 1410 as having three (3) conductive legs 1410a, 1410b, 1410c. However, this is for illustrative purposes only. Those of ordinary skill in the art will readily appreciate that there may be more or fewer legs coupled to lead frame 1410 as needed or desired. Regardless of the number of conductive legs, however, the legs 1410a, 1410b, 1410c of lead frame 1410, as seen in FIG. 15B, can be bent during the trim and form stage (box 1316 of FIG. 13) so that the conductive legs make appropriate physical contact with an underlying substrate, such as a printed circuit board (PCB) for example.

As seen in FIG. 15A, a thin metal wire 1504 extends between a bond pad 1506 disposed on the surface of die 1404a and a target pad 1508 disposed on each leg 1410a, 1410b, 1410c of lead frame 1410. In some embodiments, a conductive film layer 1502 may be disposed between target pad 1508 and each leg 1410a, 1410b, 1410c of lead frame 1410. Both the bond pad 1506 and the target pad 1508 comprise a thin conductive, metallic layer or film, such as silver, for example. However, as those of ordinary skill in the art will understand, it is possible that one or both of the bond pad 1506 and the target pad 1508 is comprised of a conductive material other than silver. Regardless of their composition, however, wire 1504 is attached to bond pad 1506 via a "ball bond" 1510, and to the target pad 1508 via a "stitch bond" 1512. The wire 1504, the ball bond 1510, and the stitch bond 1512 provide the physical means that create the electrical connection between the die 1404a and the legs of the lead frame 1410.

FIGS. 16A-16D illustrate an example method 1600 for forming the ball bond 1510 and the stitch bond 1512 according to one embodiment of the present disclosure. As seen in these figures, a feeder wire 1604 extends through a bore of a capillary tool 1602. Generally, the feeder wire 1604 comprises a conductive material such as gold, copper, or aluminum, for example.

To create the ball bond 1510, a high voltage electrical charge is applied to the feeder wire 1604 (FIG. 16A). This charge melts the terminal end of the feeder wire 1604. However, rather than drip or fall away, surface tension causes the melted feeder wire 1604 to form into a ball 1606 at the tip of capillary tool 1602. The capillary tool 1602 is then lowered towards die 1404a such that the molten ball 1606 is pressed onto bond pad 1506, which in some cases may be heated (FIG. 16B). Heat (e.g., thermo-compression) and/or ultrasound energy (e.g., ultrasonic energy), for example, are then applied along with the downward pressure of capillary tool 1602 to form the ball bond 1510.

The capillary tool 1602 is then lifted away from ball bond 1510 and moved towards a target pad 1508 of lead frame 1410. Capillary tool 1602 then descends to contact target pad 1508 thereby crushing the feeder wire 1604 between the tip of the capillary tool 1602 and the surface of target pad 1508 (FIG. 16C). The pressure applied on the feeder wire 1604 by capillary tool 1602, along with heat and/or ultrasound energy, forms the stitch bond 1512. So formed, the capillary tool 1602 is then lifted away from the target pad 1508, which causes the feeder wire 1604 to tear, and moved to the next bond pad 1506 to form the next ball bond 1510 (FIG. 16D).

Wire bonding is a very complex procedure made even more complex by likely multiple dies on an IC chip. Embodiments of the present disclosure read and record multiple process parameters during bonding. According to the present embodiments, and as described more fully below, the process parameters can be used to generate an anomaly indicator indicating a risk that an anomaly occurred during such bonding operations.

Figure 17:
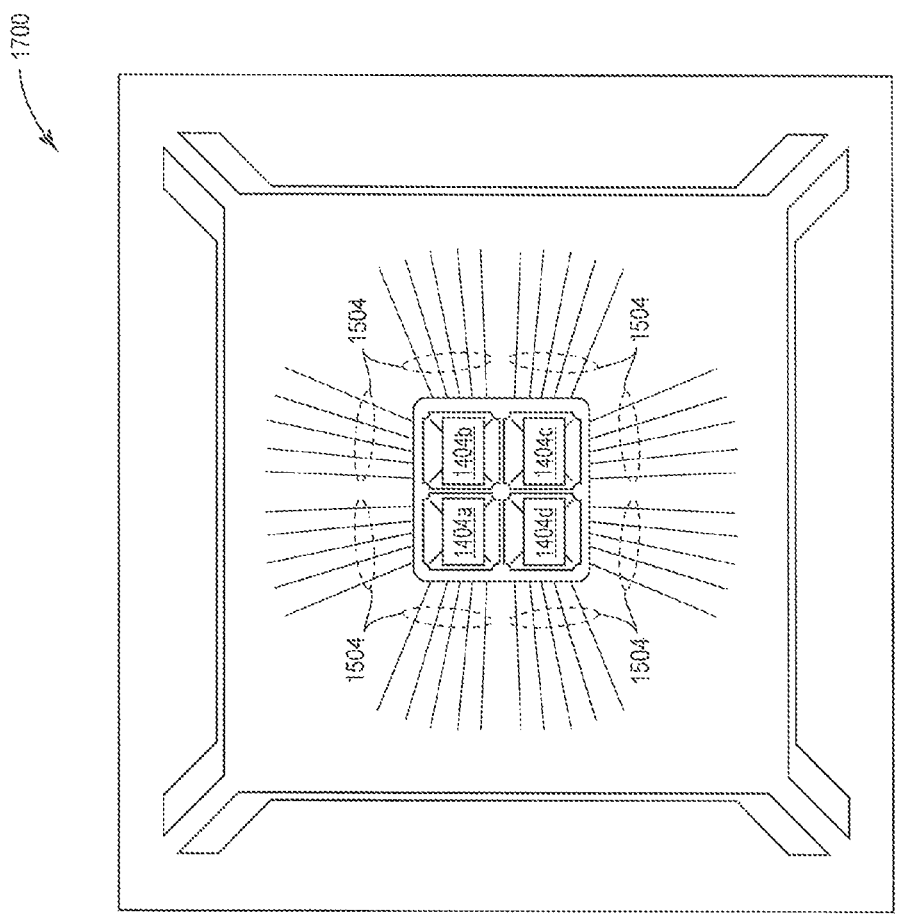
FIG. 17 illustrates an example integrated circuit chip according to at least one embodiment of the present technology.

FIG. 17 is a perspective view of an example IC chip 1700 that has undergone the back end of the semiconductor manufacturing process previously described. As seen in FIG. 17, IC chip 1700 comprises a plurality of die 1404a, 1404b, 1404c, and 1404d. Each die 1404a, 1404b, 1404c, 1404d has its own bonding connections to lead frame 1410, and thus, is physically and electrically connected to lead frame 1410 via wires 1504 and the ball and stitch bonds 1510, 1512, respectively, as previously described. This embodiment illustrates a wire layout of 40 wires 1504. However, those of ordinary skill in the art should readily appreciate that this is merely for illustrative purposes. Such wire layouts may comprise more or fewer wires 1504, as needed or desired.

In one embodiment, dies 1404a, 1404b, 1404c, 1404d all have the same number of wires 1504 connecting them to lead frame 1410. However, this is not required. Dies 1404a, 1404b, 1404c, and 1404d may not necessarily have the same number of wires 1504. For example, die 1404a may have a first number of wires 1504 connecting it to lead frame 1410, and die 1404c may have a second, different number of wires 1504 connecting it to lead frame 1410. One or both of the other die 1404b, 1404d may also have the same or different number of wires than the other die on IC chip 1700.

As explained above, the back end of the semiconductor manufacturing process may include an inspection and testing stage (e.g., box 1318 in FIG. 13). During this stage, the quality of the ball bonds 1510 and the stitch bonds 1512 that were created in the wire bonding stage (e.g., box 1308 in FIG. 13) are tested. Such testing is not performed on all completed IC chips, but rather, on a representative sample of IC chips from each lot.

In general, there are different types of tests for determining the quality of a wire bond—non-destructive and destructive. Non-destructive tests generally involve a visual inspection of the ball bonds 1510 and stitch bonds 1512 and infer the quality of those bonds by their respective diameters. Provided they pass the visual inspection, the IC chips can be placed back into the workflow for distribution. Visual inspection, though, can be an inaccurate, error-prone way in which to infer the quality of a bond.

Destructive tests, in contrast, break a bond by damaging or deforming the ball and stitch bonds 1510, 1512 and/or the wire 1504 such that the IC chips under inspection cannot be returned for distribution. Therefore, although destructive tests are useful for determining an exact point of failure of a given ball and/or stitch bond 1510, 1512, they are necessarily time consuming and expensive, and are often conducted by separate testing machines. Further, since the bond is destroyed it can only be used to make inferences regarding the quality of other bonded chips that did not undergo destructive testing.

Generally, the semiconductor manufacturing industry relies on two particular destructive tests. These are the "ball shear" tests and the "stitch pull" tests. For details on these tests, the interested reader is directed to government mandated standards for microelectronic devices (e.g., United States government standards in Revision K of MIL-STD-883C entitled "Test Method Standard—Microcircuits" released Apr. 25, 2016, for military and aerospace electronic systems, which is incorporated herein by reference in its entirety). Briefly, however, "ball shear" testing is used for testing the quality of the ball bonds 1510, while "stitch pull" testing is used for testing the quality of the stitch bonds 1512.

FIGS. 18A-18C are perspective views illustrating an example method 1800 for performing ball shear testing. As seen in these figures, the ball bond 1510 is bonded to the bond pad 1506 (FIG. 18A). A tool arm 1802 is positioned above the bond pad 1506 and moved laterally into pressing contact with the ball bond 1510 (FIG. 18B). The tool arm 1802 continues to move laterally against the ball bond 1510 until the force applied by the tool arm 1802 causes the ball bond 1510 to separate (i.e., shear) from the bond pad 1506 (FIG. 18C). The shearing destroys the bond. The shear force applied by the tool arm 1802 is measured throughout testing (e.g., in grams). Therefore, at the end of testing, the exact amount of shear force needed to shear the ball bond 1510 away from the bond pad 1506 is known.

FIGS. 19A-19C are perspective views illustrating an example method 1900 for performing stitch pull testing. As above, the stitch bond 1512 is attached to the target pad 1508 and the ball bond 1510 is attached to the bond pad 1506.

In stitch pull testing, a hook tool 1902 is lowered and placed under the wire 1504 (FIG. 19A). So positioned, the hook tool 1902 is then raised into contact with the wire 1504 (FIG. 19B). The hook tool 1902 continues to move upward so that it applies an upward force on wire 1504. Eventually, this upward force pulls the stitch bond 1512 away from the target pad 1508, effectively pulling the wire 1504 away from the lead frame 1410 (FIG. 19C) and destroying the bond. The upward force applied by hook tool 1902 is measured throughout testing (e.g., in grams). As such, at the end of testing, the exact amount of upward force needed to lift the stitch bond away from the target pad 1508 can be determined.

To perform these destructive tests, selected IC chips are physically moved from whatever machine is performing the wire bonding stage to another machine configured to perform the testing. Often times, these actions are performed manually. Further, not all ball bonds 1510 and stitch bonds 1512 of a given IC chip are tested. In contrast, only a representative sample of those bonds are tested.

Because these tests are so destructive, the IC chips under test are destroyed—even though not all bonds on the IC chip are tested. Therefore, chip manufacturers usually take a representative sample of IC chips from a given lot and then perform these destructive tests on that representative sample. The results achieved from testing the sample(s) are then stored and subsequently used to make inferences about the quality of the IC chips in that lot.

Such tests, however, are very time consuming and can slow the integrated chip manufacturing process. Further, because these tests destroy the IC chips, they must be discarded rather than sold. Destructive testing, therefore, is also costly.

Additionally, a question arises as to which wires 1504 on a given IC chip should be selected for testing. Ideally, IC chips with poor quality wires and/or bonds should be identified prior to leaving the factory floor. However, there is no guarantee that a given random sample of IC chips and their corresponding wires and bonds will include such IC chips. Moreover, it is still possible that the random sample of IC chips and wires incorrectly certifies a given lot to be of acceptable quality. Currently, there is no informed method for identifying IC chips having poor quality bond connections. Therefore, there is no current way to identify the particular wires, or subset of wires, to undergo quality testing.

Similar problems occur in other types of bonding situations. As such, a bonder will either have to opt for destructive testing, which destroys the bond under study, or non-destructive testing. Previous, conventional testing techniques for non-destructive testing were likely to be inaccurate and time-consuming requiring manual, visual inspections. Further, previous testing approaches are often conducted on only a small subset of the products in a given lot. Therefore, there are typically issues with determining which products to test.

Embodiments of the present disclosure, therefore, address these and other concerns by providing a model specifically for predicting possible anomalies without having to destroy the bond (e.g., predicting the forces needed for shearing the ball bond 1510 from the bond pad 1506, and for separating the stitch bond 1512 from the target pad 1508 without having to conduct the quality assurance test). Techniques can use feature engineering to select and transform relevant variables derived from raw data measurements to process data for a model (e.g., a predictive model designed using machine learning or statistical modeling). Feature engineering can involve creating of features by identifying raw variables that will be useful predictive variables for a predictive model and/or creating derived features from manipulating raw variables (e.g., addition, subtraction, multiplication, and ratios). Feature engineering can involve transformations by further manipulating created predictor variables to perform model performance (e.g., ensuring variables are on a same scale, or are within an acceptable range for a model). Feature engineering can involve feature extraction by automatic creating of new variables from raw data; and feature selection by using algorithms to analyze, judge, and rank features to determine features for a model (e.g., to remove irrelevant or redundant features).

Particularly, the embodiments disclosed herein utilize the process data measured during the bonding operations (e.g., wire bonding) to develop analytical models. Process parameters obtained through feature engineering may be referred to herein as "motion features". The analytical models allow users to accurately estimate the ball shear and stitch pull forces (i.e., values) that, until now, were obtainable only through destructive testing. Thus, the present embodiments can accurately predict the quality of the wire bonds based on the motion feature data.

Such accurate predictions provide benefits and advantages that conventional testing methods do not provide. For example, analytical models generated according to the present embodiments can reduce the amount of inspection that is performed and can eliminate it altogether in some instances. Even in situations where a certain amount of inspections or destructive testing is required for contractional reasons, approaches herein can enable a manufacturer to be strategic in the product population for sampling. For instance, IC chips that are predicted by the present embodiments to have poor quality bonds may be scraped from the population for shipping, and thus from the sampled population. Sampling a better population may provide an overall improvement in field quality and may improve efficiency (e.g., by reducing the chance of recall or rejection of a shipped and sampled set).

As stated previously, one or more embodiments described herein are explained in the context of bonding for an integrated circuit merely as an example. One of ordinary skill in the art will appreciate that techniques described herein can be applied to other types of bonding operations.

Figure 20A:
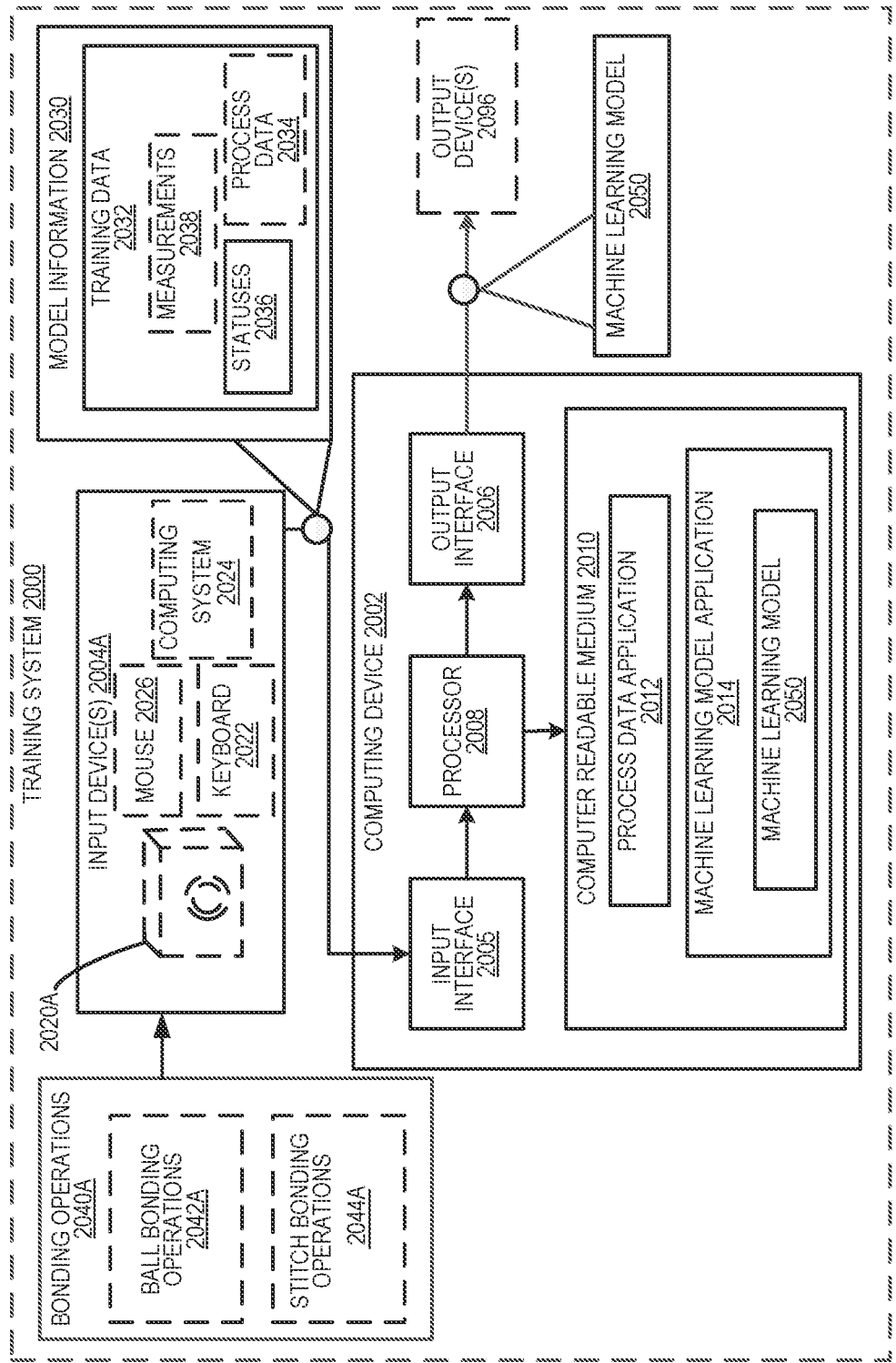
FIG. 20A illustrates an example block diagram of a training system in at least one embodiment of the present technology.

FIG. 20A illustrates an example block diagram of a training system 2000. For example, the training system may be useful for training a computer model to make predictions regarding a bonding operation. For instance, the bonding operation could be a bonding operation described herein such as an adhesive bonding operation (e.g., to adhere a windshield to a vehicle or in wafer bonding) or a welding bonding (e.g., for wire bonding) to name a few. There are many types and sub-types of bonding. For instance, with welding bonding there are sub-types including tungsten inert gas (TIG) welding, also known as heliarc and gas tungsten arc welding (GTAW); flux-cored arc welding (FCAW); stick welding, also known as shielding-metal arc welding (SMAW), metal inert gas (MIG) welding, also known as gas metal arc welding (GMAW), laser beam welding, electron-beam welding, plasma arc welding, atomic hydrogen welding, and electroslag welding. For brevity, different possible bonding operations or hybrid bonding operations are referred to herein as simply a bonding operation.

Training system 2000 includes a computing device 2002. The training system 2000 is configured to exchange information between devices in the system (e.g., via wired and/or wireless transmission). For example, a network (not shown) can connect one or more devices of training system 2000 to one or more other devices of training system 2000.

For instance, in one or more embodiments, the training system 2000 includes one or more input devices 2004A for receiving information pertaining to a bonding operations 2040A via one or more input interfaces 2005 (e.g., for training the computing device 2002). For example, if the training system is training a system to make predictions regarding a bonding operation, the bonding operations 2040A may include a system for bonding operations. Bonding operations occur in many different environments (e.g., manufacture or construction environments). For instance, in an integrated circuit manufacture environment, bonding may be used to bond one or more wires to a surface (e.g., using ball, wedge, stitch, and/or compliant bonding). The bonding operations 2040A can comprise bonding wires of a first set of multiple wires to corresponding surfaces of a first set of surfaces to form integrated circuit chips. The bonding operations 2040A may have different types of bonding operations. For example, the environment 2040A may include ball bonding operations 2042A and/or stitch bonding operations 2044A.

In one or more embodiments, the computing device 2002 may receive model information 2030 for building a model to represent the bonding operations 2040A or a subsequent environment. As an example, the computing system may receive training data 2032 for building a model.

The training data 2032 may include measurements 2038 of the bonding operations 2040A. Additionally, or alternatively, the training data 2032 may include process data 2034, the process data may be generated from the measurements 2038. For instance, the process data may comprise a measurement of the measurements 2038 or be generated information for one or more measurements, or measurement types. For instance, if the bonding operations 2040A is a part of a physical environment, an input device such as a sensor 2020A may capture measurements 2038 about the physical environment such as heat measurements for heating a bonded surface or bonding agent and/or force measurements for force used to bond materials. Additionally, or alternatively, the environment may be a simulated environment or comprise additional simulated actions or computations for a physical environment (e.g., a simulated aspects of bonding operations 2040A or inferred information from measurements 2038) and a computing system component (e.g., computing device 2002 or computing system 2024) may generate information about the physical or simulated environment (e.g., process data 2034). Additionally, or alternatively, the computing device 2002 itself may derive process data 2034 (e.g., using process data application 2012).

Additionally, or alternatively, the training data 2032 comprises statuses of bonding. As an example, each status of the statuses could comprise one or more candidate outcomes for an objective related to detecting one or more anomalies in the bonding operations 2040A. For instance, if the bonding operations 2040A comprise operations to bond a first set of multiple wires to a first set of surfaces, the statuses could be statuses of the multiple wires after bonding to the first set of surfaces (e.g., a quality status or a performance status). The candidate options could comprise one or more defective chip outcomes for the integrated circuit chips in the bonding operations 2040A. The candidate options could also be on an individual wire level (e.g., a quality assurance test outcome for an individual wire level).

Additionally, the training system 2000 includes one or more output devices 2096 for outputting via one or more output interfaces 2006 information based on the bonding operations 2040A. For instance, the computing device 2002 can output a machine learning model 2050 implementing a predictive model based on training data 2032 related to the bonding operations 2040A. For instance, the computing device 2002 may generate one or more weights for the process data such that the process data input to the machine learning model predicts the one or more candidate outcomes for an objective (e.g., an objective related to detecting one or more anomalies in the bonding operations 2040A).

As an example, the machine learning model 2050 can be trained by supervised learning based on receiving the training data and using it to generate one or more weights such that the machine learning model can predict the candidate outcomes. For example, if a set of measurements is received for a wire and that wire is then tested and given a status of normal or anomaly, the measurements can be weighted to predict that status as normal or anomaly for future measurements where the status may be unknown (e.g., where the test would destroy or damage a bond from a bonding operation).

The computing device 2002 has a computer-readable medium 2010 and a processor 2008. Computer-readable medium 2010 is an electronic holding place or storage for information so the information can be accessed by processor 2008. Computer-readable medium 2010 can include, but is not limited to, any type of random access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 2008 executes instructions (e.g., stored at the computer-readable medium 2010). The instructions can be carried out by a special purpose computer, logic circuits, or hardware circuits. In one or more embodiments, processor 2008 is implemented in hardware and/or firmware. Processor 2008 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 2008 in one or more embodiments can retrieve a set of instructions from a permanent memory device and copy the instructions in an executable form to a temporary memory device that is generally some form of RAM, for example. Processor 2008 operably couples with components of computing device 2002 (e.g., input interface 2005, with output interface 2006 and with computer-readable medium 2010) to receive, to send, and to process information.

In one or more embodiments, computer-readable medium 2010 stores instructions for execution by processor 2008. For example, in one or more embodiments, the computer-readable medium 2010 comprises instructions for a process data application 2012 to select or derive process data 2034 and machine learning model application 2014 to derive a machine learning model 2050 as described herein.

In one or more embodiments, one or more applications stored on computer-readable medium 2010 are implemented in software (e.g., computer-readable and/or computer-executable instructions) stored in computer-readable medium 2010 and accessible by processor 2008 for execution of the instructions. The one or more applications can be integrated with other analytic tools such as that offered by SAS Institute Inc. of Cary, N.C., USA. Merely for illustration, the applications are implemented using or integrated with one or more SAS software tools such as JMP®, Base SAS, SAS® Enterprise Miner™, SAS/STAT®, SAS® Event Stream Processing, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML® all of which are developed and provided by SAS Institute Inc. of Cary, N.C., USA.

In one or more embodiments, fewer, different, and additional components can be incorporated into computing device 2002 or a system comprising computing device 2002. For instance, in one or more embodiments, there are multiple input devices 2004 (e.g., keyboard 2022, mouse 2026 and computing system 2024). In the same or different embodiments, there are multiple output devices 2096. As another example, the same interface supports both input interface 2005 and output interface 2006. For example, a touch screen provides a mechanism for user input and for presentation of output to the user. Alternatively, the input interface 2005 has more than one input interface that uses the same or different interface technology. Alternatively, or additionally, the output interface 2006 has more than one output interface that uses the same or different interface technology. In one or more embodiments, the functionality of the one or more input devices 2004 or one or more output devices 2096 are integrated into computing device 2002. One or more applications can be combined or further broken into separate applications.

Figure 20B:
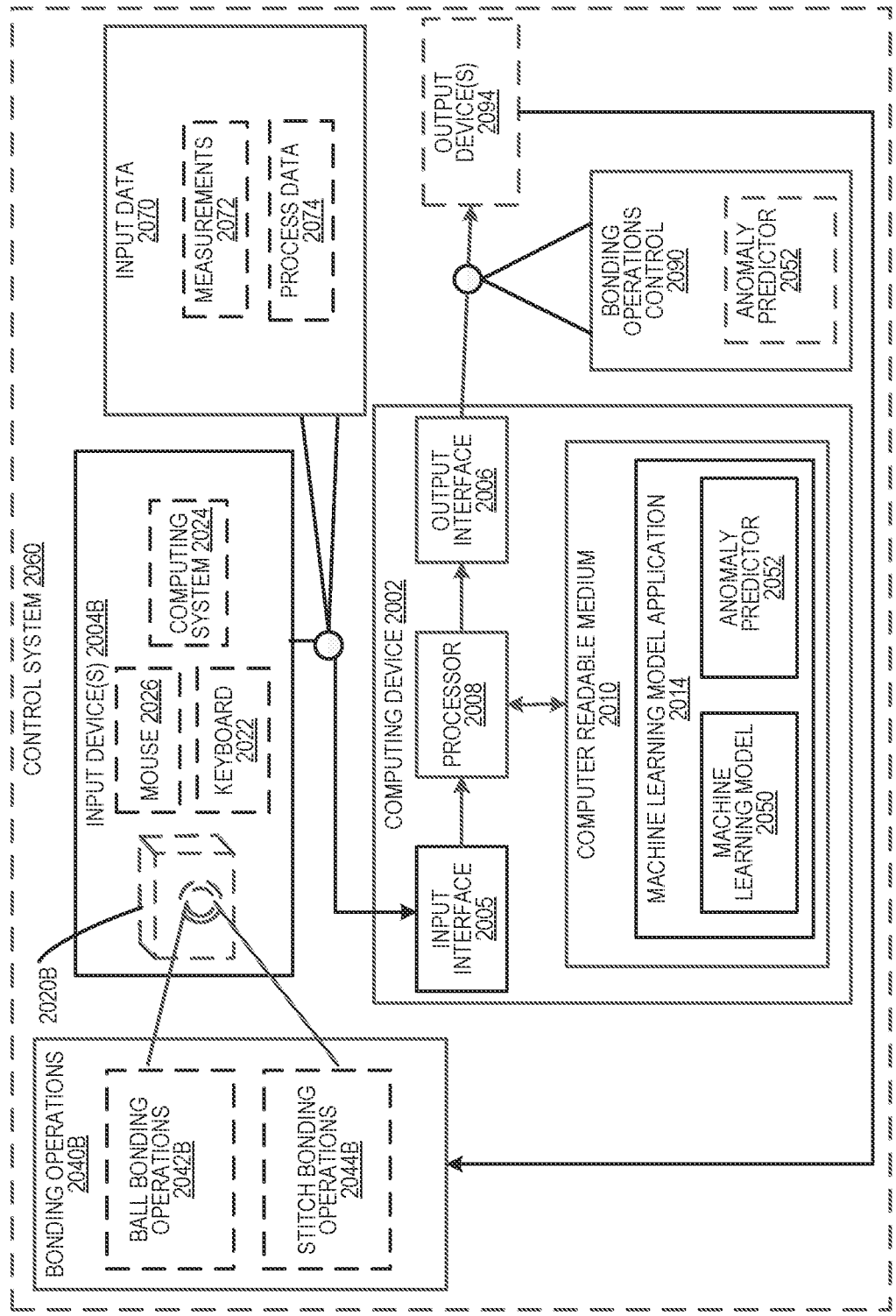
FIG. 20B illustrates an example block diagram of a control system in at least one embodiment of the present technology.

A machine learning model 2050 can be used by a control system to make predictions about or control another environment. FIG. 20B illustrates an example block diagram of a control system 2060 for bonding operations 2040B. In this example, bonding operations 2040A and the bonding operations 2040B are different bonding operations. For instance, bonding operations 2040A can be a first set of bonding operations comprising operations to bond a first set of multiple wires to a first set of surfaces and bonding operations 2040B can be a second bonding operations comprising operations to bond a second set of multiple wires to a second set of surfaces. The second set of multiple wires may be different than the first set of multiple wires. For instance, the first set of wires may have been destroyed to determine statuses pertaining to the bonding operations 2040A or the bonding operations 2040A and bonding operations 2040B (e.g., ball bonding operations 2042B and/or stitch bonding operations 2044B) may be at different manufacturing locations or be performed at different times. The second set of surfaces may be different than the first set of surfaces (e.g., the second set of surfaces may pertain to a different batch of integrated chips than the first set of surfaces). Embodiments herein provide a framework for making predictions about bonding operations based on training received in a previous bonding operation. Using this framework bonds need not be destroyed to make predictions about their quality and/or to control bonding operations to ensure quality bonds.

The control system 2060 is configured to exchange information between devices in the control system 2060 (e.g., via wired and/or wireless transmission). For example, a network (not shown) can connect one or more devices of control system 2060 to one or more other devices of control system 2060. Alternatively, or additionally, the control system 2060 is integrated into one device (e.g., the computing device 2002 may be at a manufacturing plant or construction site and comprise equipment to capture information pertaining to both the bonding operations 2040A and the bonding operations 2040B). In this example, the control system 2060 comprises the computing device 2002 of FIG. 20A. In other examples, the control system 2060 comprises a different computing device. For example, a computing device for the training system 2000 may be in the bonding operations 2040A and another computing device for the control system 2060 may be in another environment (e.g., a different manufacturing plant or construction site). For instance, the computing device 2002 could instead be an output device 2096 or receive a machine learning model 2050 from output device 2096. Regardless the computing device 2002 has access to a machine learning model. In this example, computer-readable medium 2010 has machine learning model 2050 trained on training data 2032 of the bonding operations 2040A.

In one or more embodiments, the control system 2060 includes one or more input devices 2004B for receiving information pertaining to a bonding operations 2040B via one or more input interfaces 2005 (e.g., for making predictions regarding the bonding operations 2040B). For instance, the computing device 2002 may receive input data 2070. The input data 2070 may indicate process data 2074 generated from measurements 2072 of the bonding operations 2040B.

The input data 2070 may be generated from measurements of the same type as training data 2032. For instance, the process data 2074 may comprise a measurement of the measurements 2038 or be generated information for one or more measurements, or measurement types. For instance, if the bonding operations 2040B is a part of a physical environment, an input device such as a sensor 2020B may capture measurements 2072 about the physical environment such as heat measurements for heating a bonded surface or bonding agent and/or force measurements for force used to bond materials. Additionally, or alternatively, the environment may be a simulated environment or comprise additional simulated actions or computations for a physical environment (e.g., a simulated aspects of bonding operations 2040B or inferred information from measurements 2072) and a computing system component (e.g., computing device 2002 or computing system 2024) may generate information about the physical or simulated environment (e.g., process data 2074). Additionally, or alternatively, the computing device 2002 itself may derive process data 2074.

Additionally, or alternatively, input data 2070 may include or be derived from less, more, or different measurement types as training data 2032. For instance, a manufacturing location may update the machine learning model 2050 to consider less, more, or different measurement types.

In one or more embodiments, the control system 2060 includes one or more output devices 2094 for outputting via one or more output interfaces 2006 information based on the bonding operations 2040B. For instance, the information may comprise bonding operations control information 2090 for controlling the bonding operations 2040B (e.g., the control information 2090 can indicate to stop or adjust the bonding operations due to predicted quality issues with the bonding operations 2040B). For example, the bonding operations control 2090 may comprise an anomaly predictor 2052 indicating a risk for an anomaly occurrence in the bonding operations 2040B. For instance, if the bonding operations 2040B comprise bonding operations to bond wires of a set of multiple wires to form integrated circuit chips, an anomaly predictor may indicate a risk of an anomaly in an integrated circuit chip manufacturing process in the bonding operations 2040B.

In one or more embodiments, the computing device has a computer-readable medium 2010 and a processor 2008 for generating an anomaly predictor 2052. For example, in one or more embodiments, the computer-readable medium 2010 comprises instructions for a machine learning model application (e.g., machine learning model application 2014) to access a machine learning model trained on training data of first bonding operations (e.g., machine learning model 2050 trained on bonding operations 2040A), weight the input data 2070 according to the machine learning model, and generate the anomaly predictor 2052 based on weighting the input data 2070 according to the machine learning model.

Figure 21A:
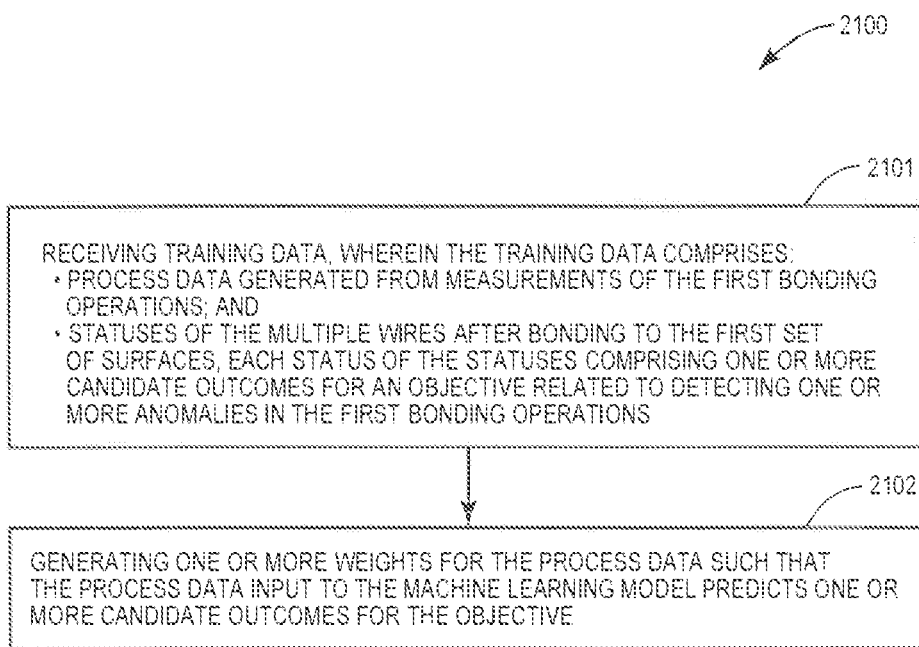
FIG. 21A is a flow diagram illustrating an example method for training a machine learning model according to at least one embodiment of the present technology.
Figure 21B:
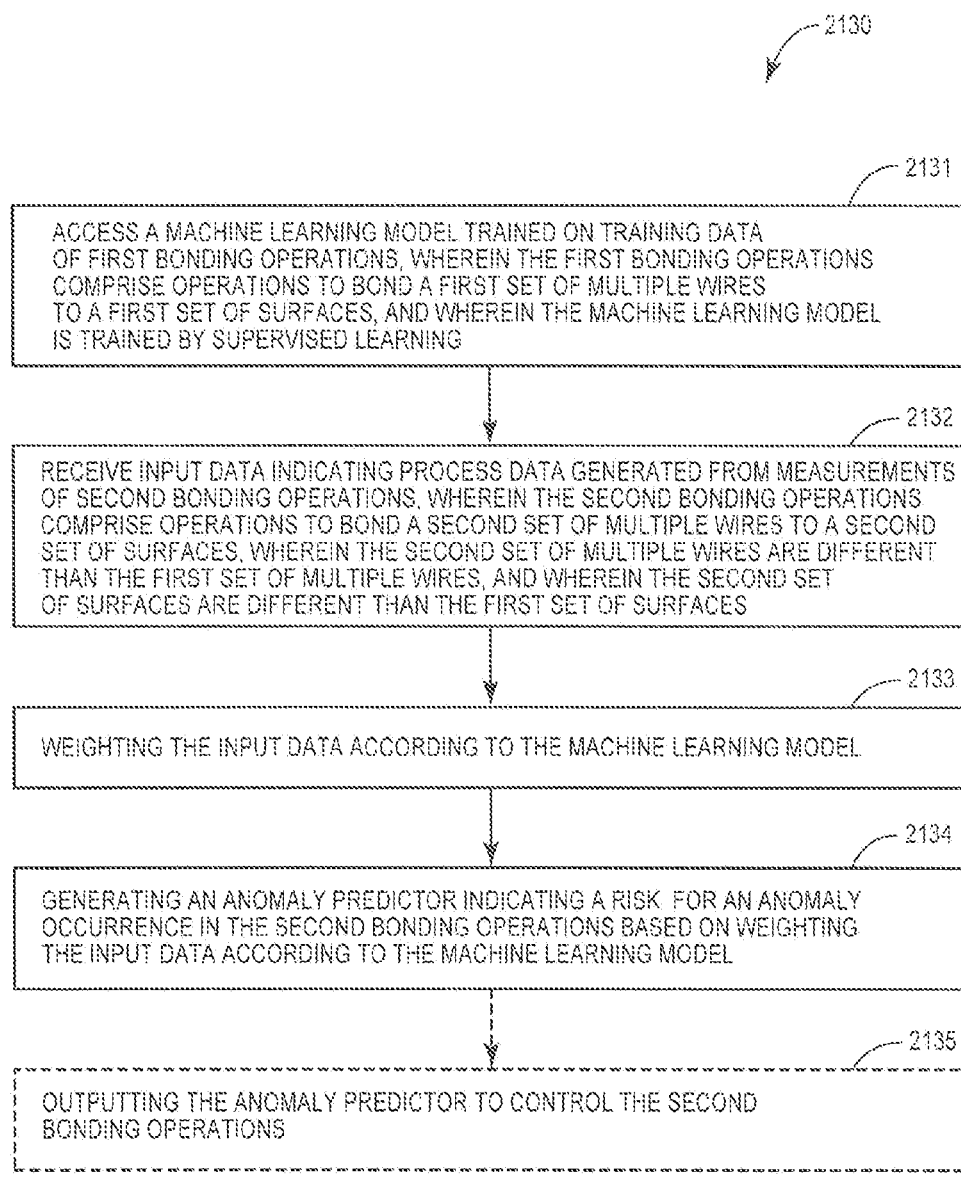
FIG. 21B is a flow diagram illustrating an example method for controlling bonding operations according to at least one embodiment of the present technology.
Figure 21C:
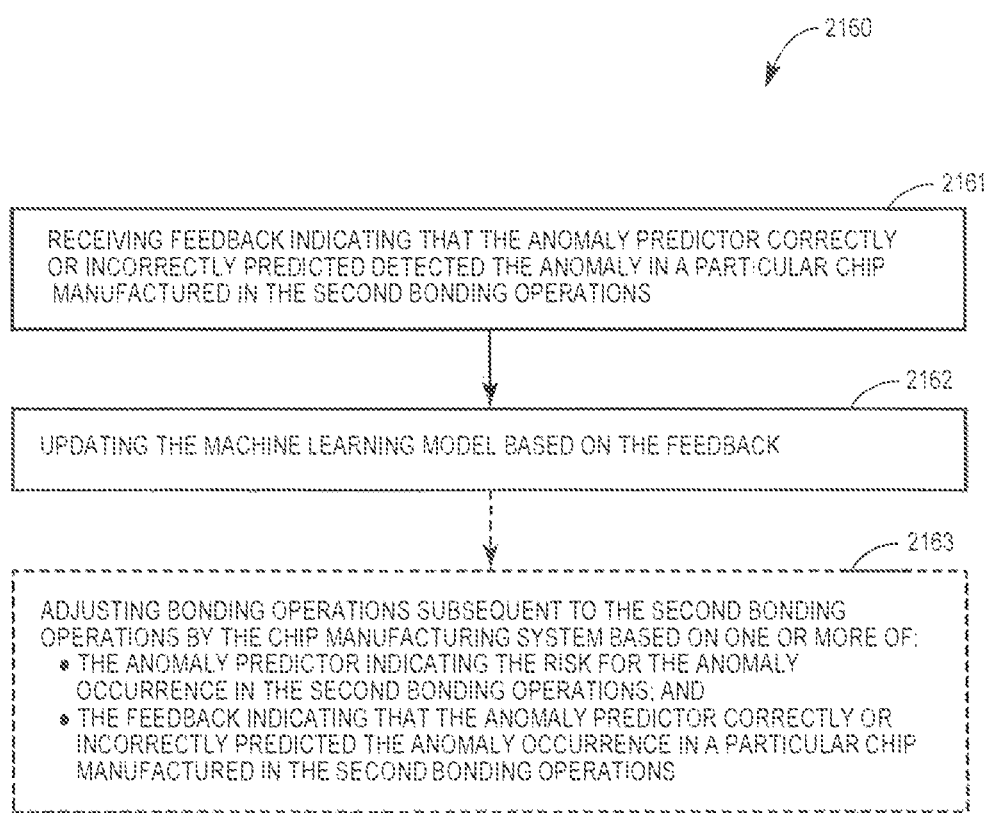
FIG. 21C is a flow diagram illustrating an example method for updating the machine learning model used to control bonding operations according to at least one embodiment of the present technology.

In one or more embodiments, a computing system (e.g., a computing device 2002, the training system 2000 and/or the control system 2060) implements a method as described herein (e.g., a method shown in FIGS. 21A-21C). For example, the computing system may be a part of an Internet of Things (IoT) system that has devices with sensors for observing an environment (e.g., a manufacturing or construction environment) and for exchanging data with other devices or systems over the internet (e.g., feedback from the environment).

FIG. 21A illustrates an example flow diagram of a method 2100 for training a machine learning model (e.g., machine learning model 2050). The method 2100 comprises an operation 2101 for receiving the training data (e.g., training data 2032). The training data comprises process data generated from measurements of the first bonding operations. The training data comprises statuses of the multiple wires after bonding to the first set of surfaces. Each status of the statuses comprising one or more candidate outcomes for an objective related to detecting one or more anomalies in the first bonding operations. For instance, the machine learning model may be trained to predict aspects related to the quality of a bond produced in a bonding operation. In this case, the one or more candidate outcomes may comprise one or more quality assurance tests for individual wires or bonds in the first bonding operations. As another example, the machine learning model may be trained to predict aspects related to a normal or defective product produced as a result of a bonding operation. In this case, the one or more candidate outcomes may comprise one or more defective chip outcomes for the integrated circuit chips in the first bonding operations. In scenarios in which the bonding operations comprising multiple bonds (e.g., a stitch bond and ball bond), predictions can be made for an individual bond (e.g., a stitch bond), a component (e.g., a wire), or product (e.g., a chip) based on measurements of parameters of the stitch bond, and/or the ball bond. For instance, in the situation where a wire is bonded at both ends to form a single path, there may be merit in including parameters for both bonds in the training data.

The method 2100 comprises an operation 2102 for generating one or more weights for the process data such that the process data input to the machine learning model predicts the one or more candidate outcomes for the objective. For instance, weighting can be used within the model to have certain variables or observations influence an algorithm more. For example, one or more weights for process data can be generated for a gradient boosting model of training data (e.g., assigning a weight of 0 to an excluded variable and the highest weight to a most important variable).

FIG. 21B is a flow diagram illustrating an example method 2130 for controlling bonding operations. The method 2130 comprises an operation 2131 for accessing a machine learning model trained on training data of first bonding operations (e.g., the machine learning model generated according to method 2100). The first bonding operations comprise operations to bond a first set of multiple wires to a first set of surfaces. The machine learning model is trained by supervised learning.

The method 2130 comprises an operation 2132 for receiving input data indicating process data generated from measurements of second bonding operations. The second bonding operations comprise operations to bond a second set of multiple wires to a second set of surfaces. The second set of multiple wires are different than the first set of multiple wires. The second set of surfaces are different than the first set of surfaces.

For instance, the input data can comprise real-time sensor measurements received during the second bonding operations (e.g., on a given wire of an integrated computer chip). Sensor measurements can enable oversight of bonding process quality without human oversight or destruction of bonds. However, input data can also include operator observations. The sensor measurements can comprise measurements of a bonding system involved in the second bonding operations. The measurements can comprise, to name a few for example, heat measurements, power-related measurements, force measurements, electric flame-off (EFO) measurements, ultrasonic measurements, ball stitch-related measurements, and ball bond-related measurements.

The method 2130 comprises an operation 2133 for weighting the input data according to the machine learning model. For instance, the model developed on training data can be used to predict anomalies in subsequent bonding operations. The method 2130 comprises an operation 2134 for generating an anomaly predictor indicating a risk for an anomaly occurrence in the second bonding operations based on weighting the input data according to the machine learning model. For instance, the anomaly predictor could be a predictor of a defect of a component of a bond (e.g., a defective bond between a wire and a lead frame or die), or a defective product (e.g., because of abnormal process conditions such as one or more of floating condition, material contamination such as lead frame contamination, and die tilt). The method 2130 comprises an operation 2135 for optionally outputting the anomaly predictor to control the second bonding operations. For instance, the anomaly predictor can control the second bonding operations to correct the one or more anomalies or reduce the occurrence of the one or more anomalies in the bonding system involved in the second bonding operations (e.g., indicating a likelihood of defects in a batch of products to either alert to further investigate the batch or alter the process for future batches).

In one or more embodiments, the anomaly predictor predicts an anomaly in an individual wire or bond in the second bonding operations without performing a destructive quality assurance test on the individual wire or bond. In this way, a bond need not be destroyed before there is some indication as to a defect in a bond of the product. For instance, a bonding operation described herein can comprise a ball bonding operation, and the destructive quality assurance tests comprise a ball shear test for testing a ball bond, which would shear off the ball bond. As another example, a bonding operation described herein can comprise a stitch bonding operation, and wherein the destructive quality assurance tests comprise a stitch pull test for testing a stitch bond, which would pull-out the stitch bond.

In one or more embodiments, a predive algorithm can be improved during subsequent bonding operations. FIG. 21C is a flow diagram illustrating an example method 2160 for updating the machine learning model used to control bonding operations.

The method 2160 comprises an operation 2161 for receiving feedback indicating that the anomaly predictor correctly or incorrectly predicted the anomaly in a particular chip manufactured in the second bonding operations. The method 2160 comprises an operation 2162 for updating the machine learning model based on the feedback (e.g., weighting differently input data or selecting different or additional input data types).

The method 2160 optionally comprises an operation 2163 for adjusting bonding operations. For instance, when the second bonding operations are performed by a chip manufacturing system, the operation 2163 comprises adjusting bonding operations subsequent to the second bonding operations by the chip manufacturing system based on one or more of: the anomaly predictor indicating the risk for the anomaly occurrence in the second bonding operations; and feedback indicating that the anomaly predictor correctly or incorrectly predicted the anomaly occurrence in a particular chip manufactured in the second bonding operations. For instance, bonding operations can be halted based on indicating a high percentage of suspected errors (e.g., to check process components or manufactured products). Different materials or force for bonding the materials can be used based on consistently indicated problems. Or a particular product can be located for correcting a product suspected of having problems. For instance, in one or more embodiments, input data comprises received sensor measurements tagged with origin information indicating one or more of an identity or location for a particular wire, die, or chip involved in the second bonding operations. The anomaly predictor identifies the anomaly that occurred in the second bonding operations and is correlated with the origin information to indicate the location of the anomaly. This can be useful for correcting an individual defective chip or process.

Figure 22A:
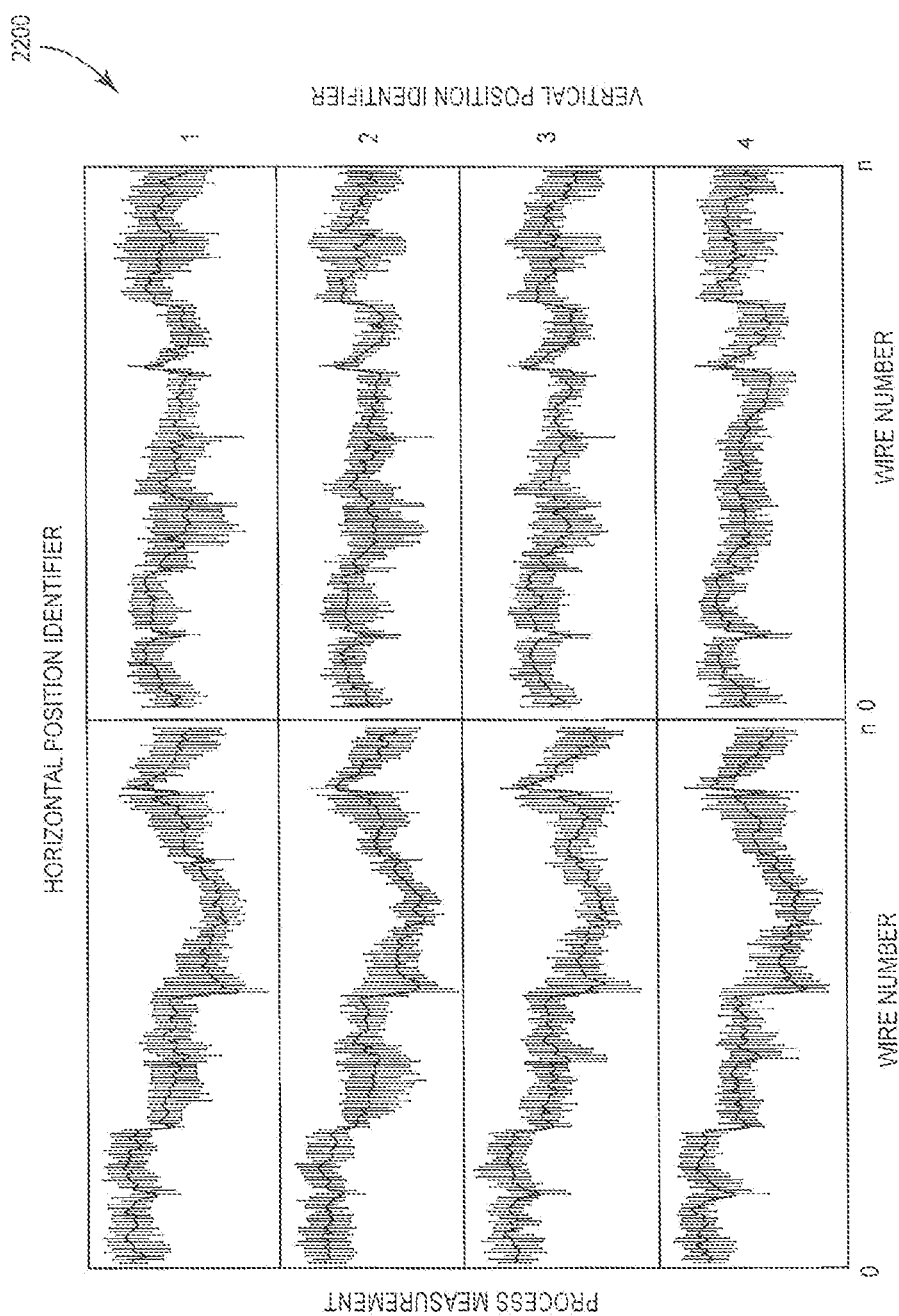
FIG. 22A is a graph illustrating a relationship between motion feature patterns and a location of a corresponding chip on a lead frame according to at least one embodiment of the present technology.
Figure 22B:
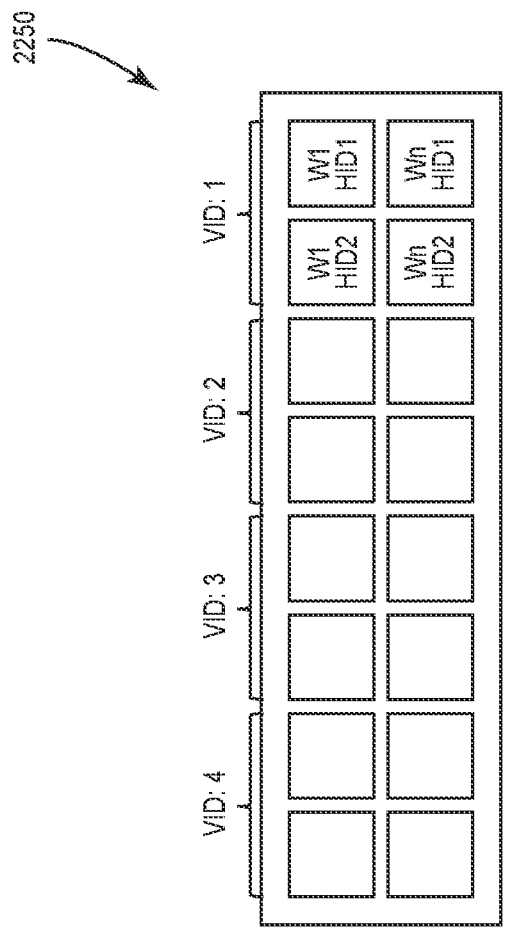
FIG. 22B illustrates example locations of the chips on a lead frame corresponding to the graph of FIG. 22A according to at least one embodiment of the present technology.

For instance, FIG. 22A is a graph 2200 illustrating a relationship between motion feature patterns and a location of a corresponding chip on a lead frame. The waveforms shown relates to continuous process measurements (e.g., force or power measurements) for each wire from 0 to n in a bonding operation. The waveforms' location in the graph correlates to an arrangement of integrated circuits being manufactured in a facility. FIG. 22B illustrates a map 2250 of example locations of the chips on a lead frame corresponding to the graph of FIG. 22A. In this example, the lead frame in FIG. 22B has 16 dies (four per vertical position identifier). The horizontal position identifier and wire number correlates to a particular wire location in map 2250 (e.g., HID 1-2, W1-n). The vertical position identifier (VID) correlates to a particular chip (e.g., VID 1-4) in map 2250. A graphical user interface can be used to display graphs and maps (e.g., graph 2200 and map 2250) to help in developing a model (e.g., to receive a user indication of important variables for building a model) and observing real-time process behavior for correcting a defective chip or process. A particular wire can have a key or identifier corresponding to a lead frame identifier, vertical position identifier, horizontal identifier, and/or wire number. In this example, there was significant variation across wire number, but for a given column number, process measurements exhibit similar patterns.

FIG. 23A illustrates an example table 2300 of Quality Assurance (QA) data 2301 comparing the training data 2302 and the test data 2303 for predictive models for destructive testing of the bonds formed during bonding operations.

In one or more embodiments, process data (subsequently, input data or training data) includes derived data such as a generated value indicating a median or average value for measurements pertaining to multiple wires bonded in a particular chip in the second bonding operations and a generated set of deviations comprising a deviation from the value for each of the multiple wires.

FIG. 23B illustrates an example method for generating a derived processing data. In this example, for each of considered factors for the machine learning model (e.g., a maximum measured impedance of a wire), a data table 2350 shows one or more derived values were computed for each selected wire number 2351 and corresponding horizontal position identifier number 2352. All the wires of a bonding operation could be considered or selectively considered. For instance, measurement data could be constrained to wires having the largest number of a target variable under consideration, such as most normal operation or poorest quality. In this example data table 2350, N is the total number of wires on a particular chip.

In this example, a first derived value was computed as the median normal value 2353 for a measurement under consideration. The median normal value is computed by taking the median of measurements with a given unique wire location (e.g., measurements for horizontal position identifier 2352 and wire number 2351 in FIGS. 22A and 23B) for a wire that passed the quality tests. A second derived value (e.g., delta value (normal) 2354) is computed by subtracting the median value from the actual measurement value for a particular wire and position identifier. Other derived values can be computed such as a delta value abnormal 2355 based on a median value including wires that exhibited abnormal behavior for quality tests.

Figure 24:
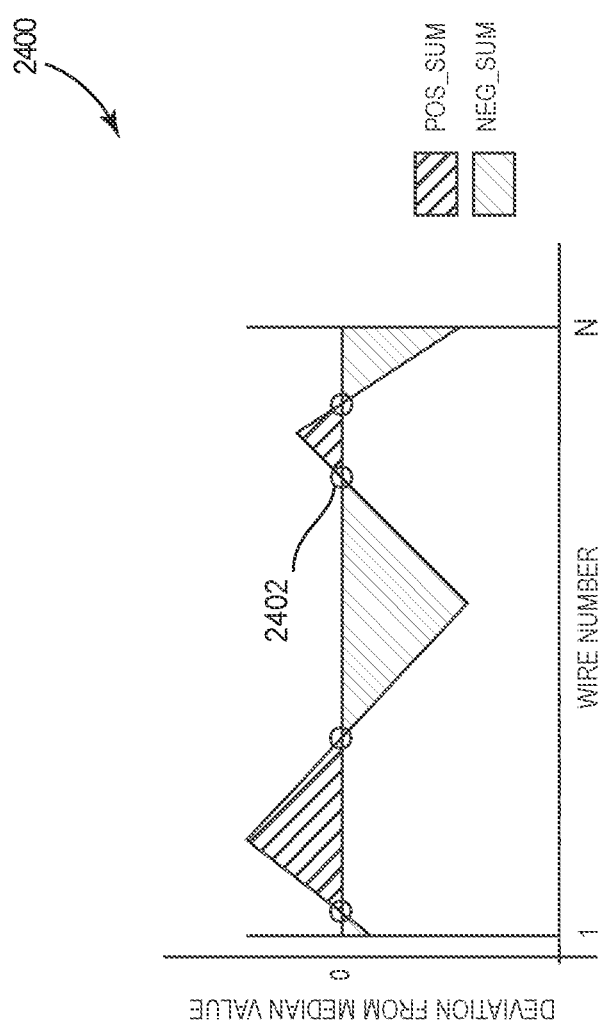
FIG. 24 is a graph illustrating an example graph for deriving process data associated with a bonding operations system according to at least one embodiment of the present technology.

Additionally, or alternatively, input data includes derived data such as a generated metric for a product accounting for sets of deviations (e.g., on a chip level accounting for deviations of bonded wires of a chip). FIG. 24 is an example graph 2400 for deriving process data associated with a bonding operations system on a chip level. In this example, one or more metrics can be computed. For example, positive sums, negative sums and number of zero crossings were used to discriminate between normal and abnormal conditions when taken one variable at a time and using wires whose bond results indicated passing quality. A positive sum value is computed by averaging the areas above the median value, i.e., $$\text{Pos\_sum} = \sum_{i=1}^{N} Del_i;$$

where $Del_i > 0$. A negative sum value is computed by averaging the areas below the median value, i.e., $$\text{Neg\_sum} = \sum_{i=1}^{N} Del_i;$$

where $Del_i < 0$. N is the total number of wires on a considered chip. The total number of zero crossings (e.g., zero crossing 2402) is 4. A model can be trained on these features to identify abnormal conditions. Fewer, less, or different chip metrics could be considered (e.g., a maximum, minimum or average value chip manufacture process measurement). In this example, analysis was done at a chip level to identify the nature of abnormal conditions. Derived process data related holistically to a particular chip of integrated circuit chips and was derived from measurement data for wires associated with a particular chip and bonded in the second bonding operations. Measurements and anomaly detection could be done with some other granularity such as on a wire or die level.

In one or more embodiments, process data is generated from derived data comprise a generated singular data value correlated with multiple different types of measurements and pertaining to a same wire. For example, measurements in a bonding operation could comprise voltage (V) and current (I) measurements for a wire, but a resistance (R) value could be derived (e.g., according to the equation V=IR). In this way this one value can account for a relationship between different measurement types.

Accordingly, in one or more embodiments, the training data comprising the process data can be generated from derived data comprising a generated singular data value can be correlated with multiple different types of measurements and pertain to a same wire in first bonding operations. The input data indicating the process data generated from measurements of second or subsequent bonding operations can comprise a generated singular data value correlated with the multiple different types of measurements and pertaining to a same wire in the second bonding operations.

Additionally, or alternatively, the training data comprising the process data can be generated by deriving information from multiple different measurement types accounting for a relationship between measurement types in the first bonding operations. The input data indicating the process data generated from measurements of the second bonding operations can comprise deriving information from multiple measurement types accounting for a relationship between measurement types in the second bonding operations.

In one or more embodiments, the process data can be used to predict information about a quality predictor for a bonding operation. For instance, the measurements in the first and second operation can comprise measurements associated with a process of forming stitch bonds and/or a process of forming ball bonds.

Figure 25:
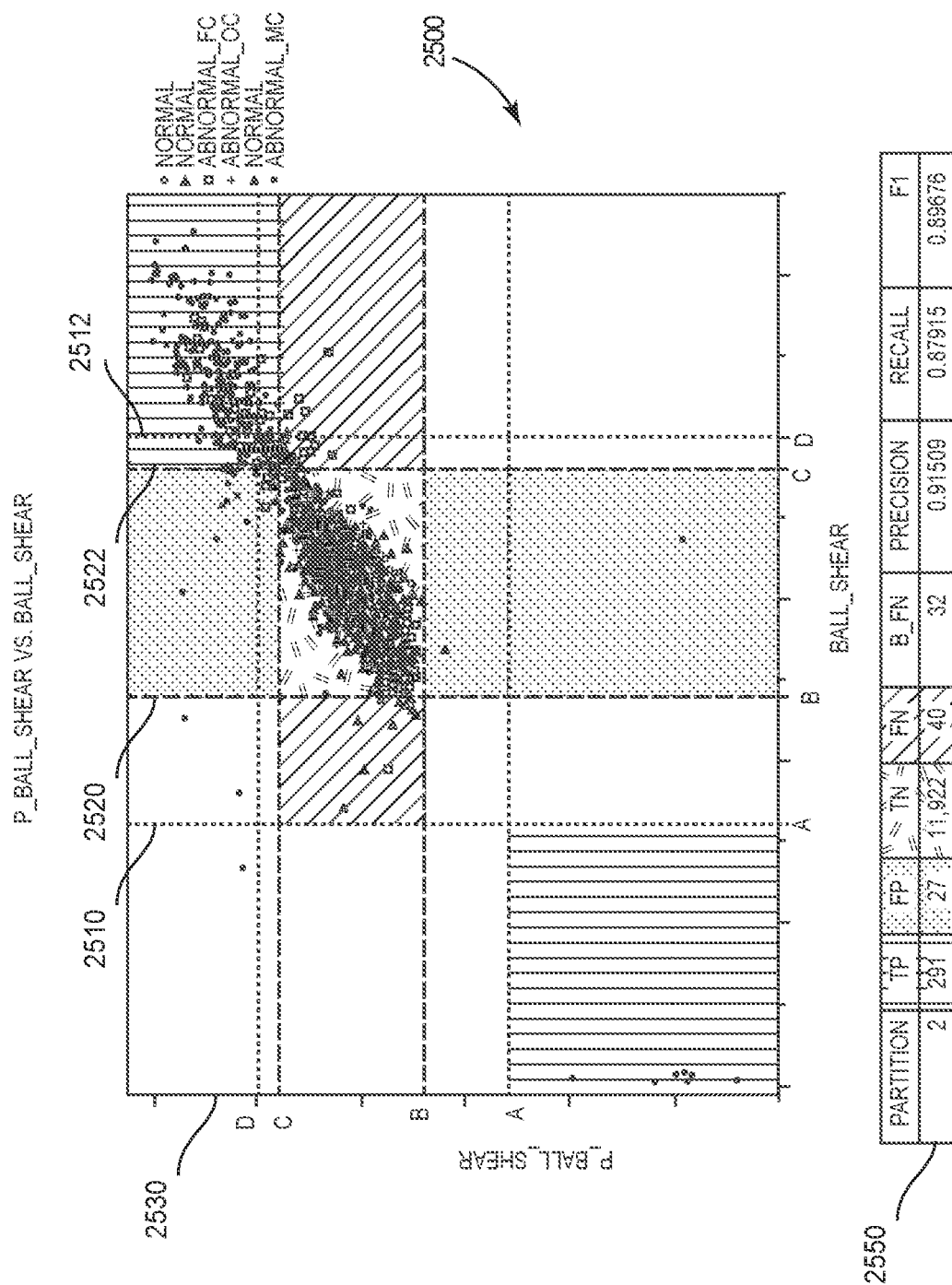
FIG. 25 is a graph illustrating the correspondence between the predicted ball shear values modeled according to the present embodiments to actual ball shear values obtained as a result of destructive testing.

FIG. 25 is a graph 2500 illustrating the correspondence between the predicted ball shear values modeled according to the present embodiments to actual ball shear values obtained as a result of destructive testing.

Specification limits are used for final acceptance or rejection of a product. In this example, divider 2510 represents a lower bound and divider 2512 represents an upper bound for specification limits for ball shear test measurements (e.g., in grams). Control limits may be used that are stricter than specification limits. Control limits are used for process control purposes to ensure that products result within specification limits. In this example, divider 2520 represents a lower bound and divider 2522 represents an upper bound for control limits for ball shear test measurements. Dividers have corresponding values on the predicted ball shear axis 2530 (e.g., the lower specification limit can be at A, the lower control limit can be at B, the upper control limit can be at C, and the upper specification limit can be at D on both axes of graph 2500). Test results for each of the destructive tests for ball shear were plotted against plotted predicted values for ball shear for different objective targets identified by the key including different normal conditions and abnormal conditions (Material Contamination (MC), Old Cap (OC), and Floating Conditions (FC)).

The accuracy of the model was evaluated. TP stand for true positives and represents bad quality bonds identified by model as Bad. TN stands for true negative and represents good quality bonds identified by model as Good. As shown in the table 2550 the graph shows most predictions where correct (291 TP and 11,922 TN). FN stands for false negative and represents bad quality bonds identified by model as Good. FP stands for false positive and represents good quality bonds identified by model as Bad. There were only a handful of false predictions (27FP and 40 FN)

Some metrics are more important for different industries. For instance, false negatives may be important in integrated circuit construction because these types of bonds can lead to increase in field returns and warranty claims. According, Benign False Negatives (B_FN) were also considered. These represent bonds with bond strength between lower (upper) spec limit and lower (upper) control limit. These False Negatives do not have poor quality with respect to specification limits. Most of the false negatives were benign false negatives (32 of 40). The models can be evaluated using statistical tools like precision, recall, and f1. For instance, precision can be computed as the number of true positives divided by the sum of the number of true positives and the number of false positives:

$$\text{precision} = \frac{\text{\# of true positives}}{\text{\# of true positives} + \text{\# of false positives}}$$

Recall can be computed as the number of true positives divided by the sum of the number of true positives and the number of false negatives:

$$\text{precision} = \frac{\text{\# of true positives}}{\text{\# of true positives} + \text{\# of false negatives}}$$

F1 is the harmonic mean of precision and recall. For instance, it can be computed as:

$$f1 = 2 * \frac{(\text{precision}) * (\text{recall})}{\text{precision} + \text{recall}}$$

The model in this example performed well for prediction with a precision rate of 0.91509, a recall of 0.8795, and a F1 of 0.89676. In this case, by using the prediction, a user could potentially avoid conducting destructive quality tests and have a close understanding of integrated circuit outcomes. Higher model accuracy can result if the 32 benign false negatives are removed from the calculation.

Figure 26:
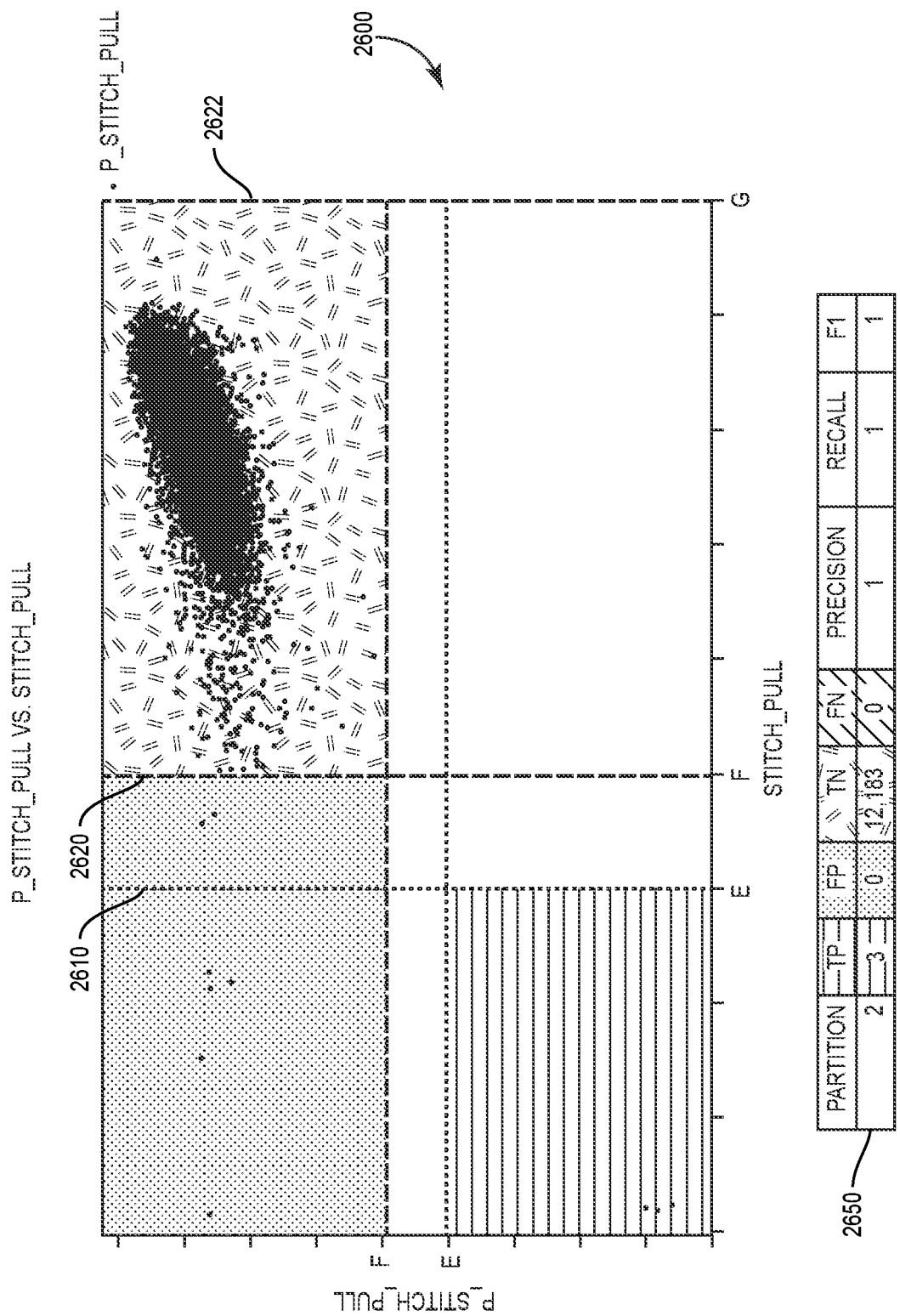
FIG. 26 is a graph illustrating the correspondence between the predicted stitch pull values modeled according to the present embodiments to actual stitch pull values obtained as a result of destructive testing.

FIG. 26 is a graph illustrating the correspondence between the predicted stitch pull values modeled according to the present embodiments to actual stitch pull values obtained as a result of destructive testing. In this case there was only one target value. Divider 2610 represents a lower bound for specification limits for stitch pull test measurements (e.g., in grams). An upper bound is not shown on the graph because it is far above the plotted values. Divider 2620 represents a lower bound and divider 2622 represents an upper bound for control limits for the stitch pull test measurements. Dividers have corresponding values on the predicted stitch pull axis 2530 (e.g., the lower specification limit is at E, the lower control limit is at F, the upper control limit is at G, and the upper specification limit is beyond the chart on both axes of graph 2600). This model also performed well with all accurate predictions as shown in table 2650 with the exception of 7 outlier wires that were excluded due to problems in the stitch pull testing having a precision, recall and F1 of 1. In addition to this model being an accurate model without the need for destructive testing, the predictive capabilities of models described herein are not susceptible to human error like occurred in the manual testing.

In the examples in FIGS. 25 and 26 a gradient boosting model was used that consisted of multiple decision trees. A predictive model defines a relationship between input variables and a target variable. The purpose of a predictive model is to predict a target value from inputs. The model is created by using training data in which the target values are known. The model can then be applied to observations in which the target is unknown. If the predictions fit the new data well, the model is said to generalize well. Good generalization is the primary goal of predictive tasks. A predictive model might fit the training data well but generalize poorly.

A decision tree is a type of predictive model that has been developed independently in the statistics and artificial intelligence communities. A gradient boosting procedure can be used to create a predictive model by fitting a set of additive trees (e.g., using the GRADBOOST related software provided by SAS Institute Inc. of Cary, N.C.).

The quality of the predictive model may depend on the values for various options that govern the training process; these options are called hyperparameters. The default values of these hyperparameters might not be suitable for all applications and a unique combination of values of these hyperparameters may be selected to minimize the objective function or some measure of accuracy. Other or additional approaches to building a model could be used then described herein. For instance, different models can be generated of different on the same type and one of the trained models selected using a validation procedure (e.g., using k-fold cross validation). Additionally other target values can be used beyond quality assurance targets.

For instance, there are multiple abnormal conditions which can be present in the wire bonding machine. These abnormal conditions can move the distribution of measured features or quality assurance values (such as pertaining to ball sheer and stitch pull) or they can also lead to defective wires. Early identification of abnormal conditions is necessary so that appropriate corrective action can be taken and reduce amount of bad quality products. Normal target variables could relate to normal operations such as indicators of a stable process, in a state of control, in- and/or out of specification rates, and absence of any systemic cause of disturbance. Abnormal conditions such as Die Tilt (DT), Material Contamination (MC), Old Cap (OC), and Floating Conditions (FC) can be predicted based on detected abnormalities in the process data.

For instance, with die tilt, a die attach process can be used for connection between die, device, and the rest of the system in electronic packaging. During this process, the die moves under the capillary force induced by the liquidus solder. Such a die tilt phenomenon usually occurs and strongly worsens the reliability and performances of devices. Predictors can be used to understand the quality of the bond from the liquidus solder. With floating conditions there can be non-sticking due to a die floating.

One type of material contamination can be lead frame contamination where there is a presence of surface organics, organic compounds and or residues on the lead frame. This can also be correlated with quality issues in the bonding.

Early action can lead to increase in the process yield that do not have these abnormalities. For instance, using the data described with respect to FIGS. 25-26, model accuracy was significant. The table below shows mean absolute percentage error (MAPE) also known as mean absolute percentage deviation (MAPD) which is a measure of prediction accuracy over observations from 5 batch productions of integrated circuit chips.

TABLE 1

| Observation | Target Variable | MAPE |
|---|---|---|
| 1 | Normal | 3.64% |
| 2 | Normal | 3.74% |
| 3 | Abnormal_FC | 3.62% |
| 5 | Normal | 3.72% |
| 6 | Abnormal_MC | 12.22% |

In the example of Table 1, the overall map for the different target variables was 4.39%. Observation 6 had four outlier points leading to a larger MAPE. If these points are excluded, the MAPE for observation 6 reduces to 5.67% and the overall MAPE drops to 3.84%.

The model to detect abnormal conditions used a gradient bosting approach on chip level features. These features are extracted using the sensor variable's (or motion feature's) chip-level waveform. The waveform has wire number on x axis and motion feature value on the y axis. The gradient boosting model has nominal target in this case. In other cases, interval target values could be used. In this example, abnormal target variables related to floating conditions (FC) and material contamination (MC). Other types of abnormal conditions may also be predicted such as die tilt.

Figures 27A, 27B:
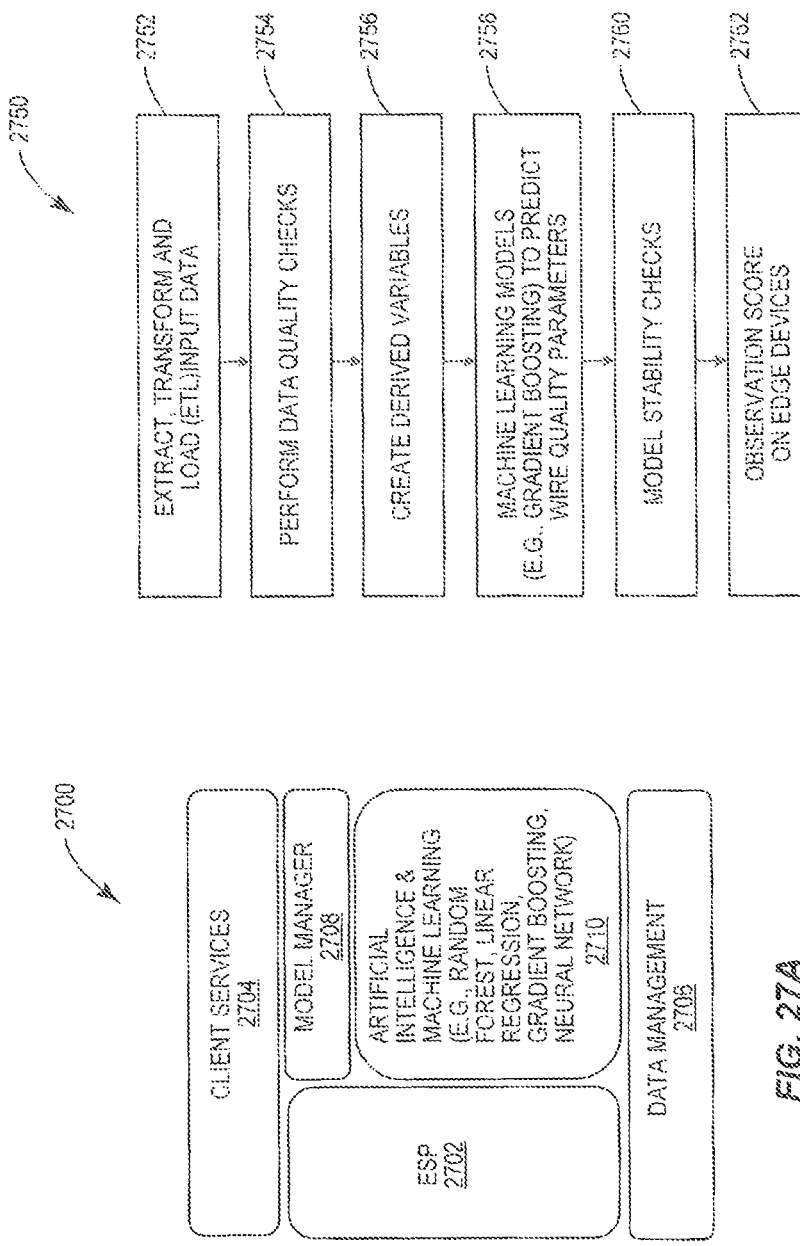
FIG. 27A is a functional block diagram illustrating a stack for an Event Stream Processing (ESP) system configured according to at least one embodiment of the present technology.
FIG. 27B is a flow diagram illustrating an example method for generating a machine learning model according to at least one embodiment of the present technology.

FIG. 27A is a functional block diagram illustrating a stack for an Event Stream Processing (ESP) system 2700 configured for streaming and edge analytics. ESP component 2702 may comprise one or more ESP engines as described herein (e.g., in FIG. 8). For instance, the ESP component may be used to provide one or more of data quality, preprocessing, AI scoring, prediction, and anomaly predictors, real-time prescriptive alerts, train in-stream, federated AI, deploy customer models and operating system, decisioning to manufacturing execution system (MES). Accordingly, ESP component 2702 can exchange information with client services 2704 devices and systems and data management systems 2706. Model manager 2708 can be used to manage, develop, and update a model described herein based on data received (e.g., by client services 2704 and/or ESP component 2702). Artificial intelligence and machine learning component 2710 can be used to train and update a model described herein (e.g., as instructed by model manager 2708). Gradient boosting was given as an example approach for constructing a model. However, additional, or different model approaches can be employed (e.g., random forest, linear regression, and neural network). Model manager 2708 and Artificial intelligence and machine learning component 2710 can exchange information with client services 2704 and data management 2706. Accordingly, embodiments described herein, e.g., the system in FIG. 27A can be used to develop analytical models to predict wire bond quality, including moving from random testing (that can often involve destructive testing) to model suggested risk-based targeted testing. Developed models can provide early indication of presence of abnormal conditions (or faults) in the manufacturing process and with lower reject rates and increase throughput rate. Edge processing can provide on-site guidance.

FIG. 27B is a flow diagram illustrating an example method 2750 for generating a machine learning model according to one embodiment of the present disclosure. As seen in FIG. 27B, method 2750 comprises an operation for developing an Extract, Transform, and Load (ETL) process to read the input data and to create the datasets used to generate the machine learning models (box 2752). In one embodiment, for example, the ETL process comprises one or more coding scripts that, when executed by the processing circuitry of a computer, extracts and combines datasets from the input data. The input data read by the ETL process may be in any form needed or desired, but in one embodiment, is formatted in a .csv file and comprises the data values that were measured during the wire bonding stage (box 1308 in FIG. 13).

Method 2750 next performs one or more quality checks on the input data (box 2754) to ensure that the input data and the datasets are of a sufficient quality to generate the machine learning models. For example, as stated above, the wire bonding machine that performs the ball and stitch bonding procedures (box 1308 in FIG. 13) is configured to measure different operating parameters while performing that process. The parameters are measured for each "run" of the back-end semiconductor manufacturing process with each run comprising a plurality of parameters representing a "lot."

According to the present disclosure, the input data is obtained in lots with each lot being analyzed to determine the quality of its data. For example, at least one aspect of the present embodiments identifies a number of different variables, variable names, and variable distributions in each lot. That data is then compared to the data associated with one or more previously obtained lots (or baseline lots having known, good data) to determine whether there are any dramatic changes in the values of the parameters (e.g., the values are not within a predefined tolerance range or are dramatically different from the baseline values). Such dramatic changes in the data may, for example, indicate that the input data is not suitable for use in generating the models.

However, even in cases where the data may be unusable, determining that dramatic differences between the parameter values exist according to the present disclosure is still beneficial. For example, die tilt and machine reading errors are some common examples of the types of things that can lead to the measurement and collection of unusable parameter values. Knowing that these errors exist, however, can enable an operator to more quickly identify and correct the issues that led to recording the input data.

As another example, the quality checks may indicate that the range of the values being measured do not adequately reflect all the values that may be produced during actual operations. Armed with this information, an operator can alter the monitoring/measurement procedures for the wire bonding stage to ensure that the appropriate operating range is adequately covered. Ensuring that the monitoring and measuring procedures adequately cover the operating ranges actually seen during production will help ensure that the values of the parameters being measured are accurate and suitable for generating the datasets and the machine learning models.

According to the present disclosure, any of the parameters related to operations during the wire bonding stage may be monitored and measured. However, in one embodiment of the present disclosure one or more of the following parameters are measured to determine anomalies related to one or more of abnormal conditions such as floating conditions and lead frame contamination.

Provided that the input data is deemed to be of sufficient quality, method 2750 transforms and/or creates one or more variables (box 2756). For example, one or more of the coding scripts that comprise the ETL process may be configured to transform variables in the input data (e.g., between units, scale values up or down, etc.). Additionally, or alternatively, one or more of the coding scripts comprising the ETL process may calculate one or more derived variables from the input data. In one example, the transformed variables and/or the calculated derived variables are used by the present embodiments to generate one or more modeling datasets. Training datasets and/or testing datasets may also be generated by the present embodiments using the transformed and/or the calculated derived variables.

Additionally, or alternatively, embodiments of the present disclosure perform an analysis on the input data to obtain distributions of predictor and target variables, as well as one or more different plots and tables of the data to indicate various statistics. In at least one embodiment, a correlation analysis is conducted on the input data to determine whether there is any correlation between the previously recorded "baseline" parameter values and those produced by one or more sensors measuring the wire bonding operations. Such analyses provide a better understanding of the input data and is very beneficial in generating the machine learning models.

With the input data appropriately processed, method 2750 next generates the machine learning models used to predict the wire quality parameters (box 2758). These models include one or more predictive models used to estimate the results of a destructive ball shear test (i.e., the force needed to shear a ball bond 1510 off of a bond pad 1506) and those of a stitch pull test (i.e., the force needed to separate the wire 1504 from the target pad 1508). Any of a variety of techniques may be utilized to generate the predictive models including, but not limited to, linear regression techniques, random forest techniques, gradient boosting techniques, and neural network techniques. In one example embodiment generating the predictive model using the gradient boosting techniques provided the most accurate results. In this embodiment, model hyperparameters were tuned using auto-tune with K-fold cross validation.

Method 2750 performs model stability checks to help ensure that the model provides accurate predictions across different data conditions (box 2760). In this step, the stability of the model hyperparameters is checked after the model has been trained. For example, in one embodiment, the tuned hyperparameters are used on a plurality of random train/test splits (i.e., the number of "runs"). The hyperparameter values can be used to train the train split and then to score the test split. The performance of the model is determined on each test split. To accomplish this, one embodiment of the present disclosure evaluates a predetermined set of model performance statistics. Some examples of the performance statistics being include, but are not limited to, an F1 ratio and a mean squared error.

Further, in some embodiments of the present disclosure, a performance evaluation summary table is generated. The summary table provides the performance evaluation using each performance statistic across all test splits. This table can have any structure needed or desired, but in at least one embodiment, this table has one or more of the following data elements (e.g., table columns): performance statistic; number of runs; Minimum; Maximum; and/or Average for particular performance metrics.

Once the model is completed, it can be used to estimate the presence or absence of abnormal conditions. For instance, the presence or absence of abnormal conditions can be determined based on observation scores by edge devices (box 2762). In some embodiments, the model will provide information that indicates the particular abnormal condition that exists. FIG. 27B shows an example method of stages comprising one or more operations. One of ordinary skill in the art will appreciate that the method could have fewer or more stages or be performed in a different order or recursively (e.g., to keep refining a model).

Figure 28:
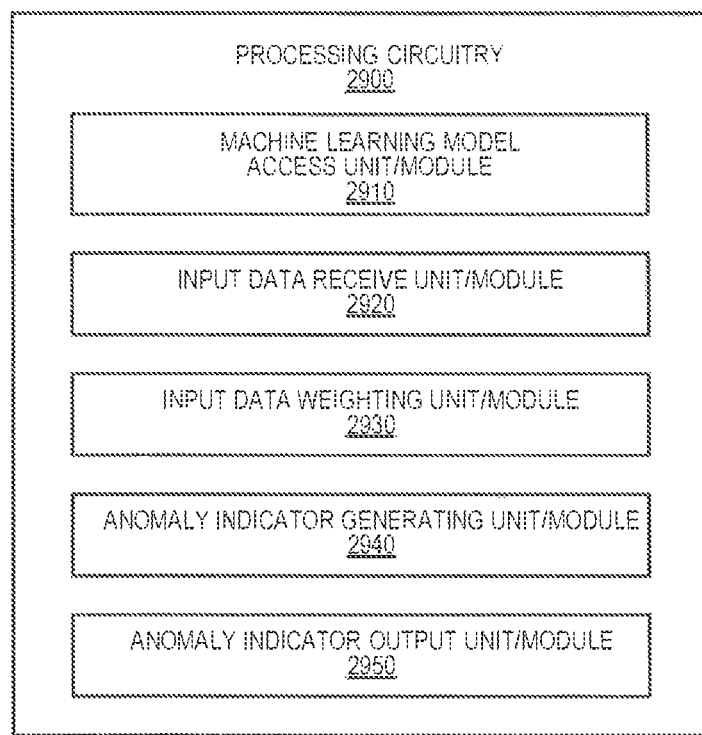
FIG. 28 is a functional block diagram of a computer program product according to at least one embodiment of the present technology.

In one or more embodiments, several different measurements can be observed, and a computing system receives training data and/or input data by selectively choosing a subset of parameter types observed in the bonding operations. The measurements used for deriving the model can be measurements for the subset of parameter types. FIG. 28 is a functional block diagram of a computer program product. In one embodiment, the computer program product comprises a control program, for example, executed by the processing circuitry of a computing device.

In more detail, FIG. 28 illustrates the processing circuitry 2900 of a computing device, as well as the units/modules that it executes. The various units/modules can be implemented by hardware and/or by software code that is executed by a processor or processing circuit. In this embodiment, the units/modules include a machine learning model access unit/module 2910, an input data receive unit/module 2920, an input data weighting unit/module 2930, an anomaly indicator generating unit/module 2940, and an anomaly indicator output unit/module 2950.

In this embodiment, the machine learning model access unit/module 2910 configures the processing circuitry 2900 to access one or more machine learning models trained on the training data of first bonding operations. In at least one embodiment, the first bonding operations are those in which a first set of multiple wires is bonded to a first set of surfaces (e.g., the ball and stitch bonds to the bond pad and the target pad, respectively). Additionally, the machine learning model is trained by supervised learning. For example, in some embodiments, the supervised training comprises receiving training data. The training data includes process data generated from measurements of the first bonding operations and statuses of the multiple wires after bonding to the first set of surfaces. Each status comprises one or more candidate outcomes for an objective related to detecting one or more anomalies in the first bonding operations. Additionally, one or more weights are generated for the process data such that the process data input to the machine learning model predicts the one or more candidate outcomes for the objective.

The input data receive unit/module 2920 configures the processing circuitry 2900 to receive input data that indicates process data generated from the measurements of second bonding operations in which a second set of multiple wires is bonded to a second set of surfaces (e.g., the ball and stitch bonds to the bond pad and the target pad, respectively). The second set of multiple wires are different than the first set of multiple wires, and the second set of surfaces are different than the first set of surfaces.

The input data weighting unit/module 2930 configures the processing circuitry 2900 to weight the input data according to the machine learning model.

The anomaly indicator generating unit/module 2940 configures the processing circuitry 2900 to generate an anomaly predictor indicating a risk for an anomaly occurrence in the second bonding operations based on the weighting of the input data according to the machine learning model.

The anomaly indicator output unit/module 2950 configures the processing circuitry 2900 to output the anomaly predictor to control the second bonding operations.

What is claimed is:

1. A computer-program product tangibly embodied in a non-transitory machine-readable storage medium, the computer-program product including instructions operable to cause a computing system to:
    access a machine learning model trained on training data of first bonding operations, wherein the first bonding operations comprise operations to bond a first set of multiple wires to a first set of surfaces, and wherein the machine learning model is trained by:
        receiving the training data, wherein the training data comprises:
            process data generated from measurements of the first bonding operations captured while performing a process of bonding the first set of multiple wires to the first set of surfaces; and
        generating one or more weights for the process data such that the process data input to the machine learning model predicts one or more candidate outcomes for an objective related to detecting one or more anomalies in the first bonding operations;
    receive input data indicating process data generated from measurements of second bonding operations captured while performing a process of bonding a second set of multiple wires to a second set of surfaces in the second bonding operations, wherein the second set of multiple wires are different than the first set of multiple wires, and wherein the second set of surfaces are different than the first set of surfaces;

weight the input data according to the machine learning model;

generate an anomaly predictor indicating a risk for an anomaly occurrence in the second bonding operations based on weighting the input data according to the machine learning model; and output the anomaly predictor to control the second bonding operations.

2. The computer-program product of claim 1,
wherein the one or more candidate outcomes comprise one or more destructive quality assurance tests for individual wires or bonds in the first bonding operations; and
wherein the anomaly predictor is a predictor of an anomaly in an individual wire or bond in the second bonding operations without performing a destructive quality assurance test on the individual wire or bond.

3. The computer-program product of claim 2, wherein the first bonding operations comprises one of:
ball bonding operations, and wherein the destructive quality assurance tests comprise a ball shear test for testing a ball bond; and
stitch bonding operations, and wherein the destructive quality assurance tests comprise a stitch pull test for testing a stitch bond.

4. The computer-program product of claim 1,
wherein the first bonding operations bond wires of the first set of multiple wires to corresponding surfaces of the first set of surfaces to form integrated circuit chips;
wherein the one or more candidate outcomes comprise one or more defective chip outcomes for the integrated circuit chips in the first bonding operations; and
wherein the instructions are operable to cause the computing system to generate the anomaly predictor for risk of the anomaly in an integrated circuit chip manufacturing process in the second bonding operations.

5. The computer-program product of claim 1, wherein the one or more anomalies are associated with one or more of:
floating condition;
lead frame contamination; and
die tilt.

6. The computer-program product of claim 1,
wherein the second bonding operations bond wires of the second set of multiple wires to form integrated circuit chips; and
wherein the process data generated from the measurements of the second bonding operations pertains holistically to a particular chip of the integrated circuit chips and is derived from measurement data for wires associated with the particular chip and bonded in the second bonding operations.

7. The computer-program product of claim 1,
wherein the input data comprises real-time sensor measurements received during the second bonding operations; and
wherein for a given wire of the second set of multiple wires, the real-time sensor measurements comprise one or more of:
heat measurements;
power measurements;
force measurements;
electric flame-off (EFO) measurements; and
ultrasonic measurements.

8. The computer-program product of claim 1,
wherein the input data comprises real-time sensor measurements received during the second bonding operations;
wherein the sensor measurements comprise measurements of a bonding system involved in the second bonding operations; and
wherein the anomaly predictor controls the second bonding operations to correct the one or more anomalies or reduce the occurrence of the one or more anomalies in the bonding system involved in the second bonding operations.

9. The computer-program product of claim 1,
wherein the input data comprises received sensor measurements tagged with origin information indicating one or more of an identity or location for a particular wire, die, or chip involved in the second bonding operations; and
wherein the anomaly predictor identifies the anomaly that occurred in the second bonding operations and is correlated with the origin information to indicate the location of the anomaly.

10. The computer-program product of claim 1, wherein the instructions are operable to cause the computing system to:
receive feedback indicating that the anomaly predictor correctly or incorrectly predicted the anomaly in a particular chip manufactured in the second bonding operations; and
update the machine learning model based on the feedback.

11. The computer-program product of claim 1,
wherein the second bonding operations are performed by a chip manufacturing system; and
wherein the instructions are operable to cause the computing system to adjust bonding operations subsequent to the second bonding operations by the chip manufacturing system based on one or more of:
the anomaly predictor indicating the risk for the anomaly occurrence in the second bonding operations; and
feedback indicating that the anomaly predictor correctly or incorrectly predicted the anomaly occurrence in a particular chip manufactured in the second bonding operations.

12. The computer-program product of claim 1, wherein the input data includes derived data comprising one or more of:
a generated value indicating a median or average value for measurements pertaining to multiple wires bonded in a particular chip in the second bonding operations;
a generated set of deviations comprising a deviation from the value for each of the multiple wires; and
a generated metric for the chip accounting for the set of deviations.

13. The computer-program product of claim 1,
wherein the training data comprises the process data generated from derived data comprising a generated singular data value correlated with multiple different types of measurements and pertaining to a same wire in the first bonding operations; and
wherein the input data indicating the process data generated from measurements of the second bonding operations comprises a generated singular data value, wherein the generated singular data value is correlated with the multiple different types of measurements and pertains to a same wire in the second bonding operations.

14. The computer-program product of claim 1,
wherein the training data comprises the process data generated by deriving information from multiple different measurement types accounting for a relationship between measurement types in the first bonding operations; and
wherein the instructions are operable to receive the input data indicating the process data generated from measurements of the second bonding operations by deriving information from multiple measurement types accounting for a relationship between measurement types in the second bonding operations.

15. The computer-program product of claim 1,
wherein the instructions are operable to cause the computing system to receive the training data by selectively choosing a subset of parameter types observed in the first bonding operations; and
wherein the measurements of the first bonding operations are measurements for the subset of parameter types.

16. The computer-program product of claim 1, wherein the one or more weights for the process data are generated for a gradient boosting model of the training data.

17. The computer-program product of claim 1, wherein the machine learning model is further trained by multiple generated machine learning models and is selected based on k-fold cross-validation.

18. The computer-program product of claim 1, wherein the measurements of the first and second bonding operations comprise measurements associated with a process of forming one of ball bonds and stitch bonds.

19. The computer-program product of claim 1, wherein the machine learning model is trained by one of:
supervised learning;
unsupervised learning; and
semi-supervised learning.

20. The computer-program product of claim 1, wherein the anomaly predictor is a predictor of a defective bond between a wire of the second set of multiple wires and a lead frame or die of the second set of surfaces.

21. A computer-implemented method comprising:
accessing a machine learning model trained on training data of first bonding operations, wherein the first bonding operations comprise operations to bond a first set of multiple wires to a first set of surfaces, and wherein the machine learning model is trained by:
receiving the training data, wherein the training data comprises:
process data generated from measurements of the first bonding operations captured while performing a process of bonding the first set of multiple wires to the first set of surfaces; and
generating one or more weights for the process data such that the process data input to the machine learning model predicts one or more candidate outcomes for an objective related to detecting one or more anomalies in the first bonding operations;
receiving input data indicating process data generated from measurements of second bonding operations captured while performing a process of bonding the second set of multiple wires to a second set of surfaces in the second bonding operations, wherein the second set of multiple wires are different than the first set of multiple wires, and wherein the second set of surfaces are different than the first set of surfaces;
weighting the input data according to the machine learning model;
generating an anomaly predictor indicating a risk for an anomaly occurrence in the second bonding operations based on weighting the input data according to the machine learning model; and
outputting the anomaly predictor to control the second bonding operations.

22. The computer-implemented method of claim 21,
wherein the one or more candidate outcomes comprise one or more destructive quality assurance tests for individual wires or bonds in the first bonding operations; and
wherein the anomaly predictor is a predictor of an anomaly in an individual wire or bond in the second bonding operations without performing a destructive quality assurance test on the individual wire or bond.

23. The computer-implemented method of claim 21,
wherein the first bonding operations bonds wires of the first set of multiple wires to form integrated circuit chips;
wherein the one or more candidate outcomes comprise one or more defective chip outcomes for the integrated circuit chips in the first bonding operations; and
wherein generating the anomaly predictor comprises generating the anomaly predictor for risk of the anomaly in an integrated circuit chip manufactured in the second bonding operations.

24. The computer-implemented method of claim 21,
wherein the second bonding operations bonds wires of the second set of multiple wires to form integrated circuit chips; and
wherein the process data generated from the measurements of the second bonding operations pertains holistically to a particular chip of the integrated circuit chips, and is derived from measurement data for wires associated with the particular chip and that are bonded in the second bonding operations.

25. The computer-implemented method of claim 21,
further comprising receiving real-time sensor measurements during the second bonding operations; and
wherein for a given wire of the second set of multiple wires, the real-time sensor measurements comprise one or more of:
heat measurements;
power measurements;
force measurements;
electric flame-off (EFO) measurements; and
ultrasonic measurements.

26. The computer-implemented method of claim 21,
wherein the receiving input data comprises receiving real-time sensor measurements during the second bonding operations, and wherein the sensor measurements comprise measurements of a bonding system involved in the second bonding operations; and
wherein the anomaly predictor controls the second bonding operations to correct the one or more anomalies or reduce the occurrence of the one or more anomalies in the bonding system involved in the second bonding operations.

27. The computer-implemented method of claim 21,
wherein the input data comprises received sensor measurements tagged with origin information indicating one or more of an identity or location for a particular wire, die, or chip involved in the second bonding operations; and wherein the anomaly predictor identifies the anomaly that occurred in the second bonding operations and is correlated with the origin information to indicate the location of the anomaly.

28. The computer-implemented method of claim 21, further comprising:
receiving feedback indicating that the anomaly predictor correctly or incorrectly predicted the anomaly in a particular chip manufactured in the second bonding operations; and
updating the machine learning model based on the feedback.

29. The computer-implemented method of claim 21, wherein the input data includes derived data comprising one or more of:
a generated value indicating a median or average value for measurements pertaining to multiple wires bonded in a particular chip in the second bonding operations;
a generated set of deviations comprising a deviation from the value for each of the multiple wires; and
a generated metric for the particular chip accounting for the set of deviations.

30. A computing device comprising processor and memory, the memory containing instructions executable by the processor wherein the computing device is configured to:
access a machine learning model trained on training data of first bonding operations, wherein the first bonding operations comprise operations to bond a first set of multiple wires to a first set of surfaces, and wherein the machine learning model is trained by:
receiving the training data, wherein the training data comprises:
process data generated from measurements of the first bonding operations captured while performing a process of bonding the first set of multiple wires to the first set of surfaces; and
generating one or more weights for the process data such that the process data input to the machine learning model predicts one or more candidate outcomes for an objective related to detecting one or more anomalies in the first bonding operations;
receive input data indicating process data generated from measurements of second bonding operations captured while performing a process of bonding the second set of multiple wires to a second set of surfaces in the second bonding operations, wherein the second set of multiple wires are different than the first set of multiple wires, and wherein the second set of surfaces are different than the first set of surfaces;
weight the input data according to the machine learning model;
generate an anomaly predictor indicating a risk for an anomaly occurrence in the second bonding operations based on weighting the input data according to the machine learning model; and
output the anomaly predictor to control the second bonding operations.

* * * * *